US 012074263B2

United States Patent
Cho et al.

(10) Patent No.: US 12,074,263 B2
(45) Date of Patent: Aug. 27, 2024

(54) DISPLAY ELEMENT WITH NOVEL REFLECTORS

(71) Applicant: Samsung Display Co., LTD., Yongin-si (KR)

(72) Inventors: Joo Woan Cho, Seongnam-si (KR); Jin Woo Choi, Seoul (KR); Byung Choon Yang, Seoul (KR); Tae Hee Lee, Hwaseong-si (KR); Hae Yun Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 419 days.

(21) Appl. No.: 17/561,382

(22) Filed: Dec. 23, 2021

(65) Prior Publication Data

US 2022/0352432 A1    Nov. 3, 2022

(30) Foreign Application Priority Data

Apr. 30, 2021 (KR) .................. 10-2021-0056298

(51) Int. Cl.
*H01L 33/50* (2010.01)
*H01L 33/10* (2010.01)

(52) U.S. Cl.
CPC ............ *H01L 33/505* (2013.01); *H01L 33/10* (2013.01)

(58) Field of Classification Search
CPC ..... H01L 33/505; H01L 33/10; H01L 33/504; H01L 25/0753; H01L 33/58; H01L 27/156; H01L 33/60; H01L 33/50
See application file for complete search history.

(56) References Cited

U.S. PATENT DOCUMENTS

| 10,388,641 | B2 | 8/2019 | Martin | |
|---|---|---|---|---|
| 11,538,796 | B2* | 12/2022 | Maegawa | ........... H01L 25/0753 |
| 2008/0068821 | A1* | 3/2008 | Wang | ...................... H01L 33/60 |
| | | | | 257/E33.072 |
| 2016/0013170 | A1 | 1/2016 | Sakariya et al. | |
| 2017/0159911 | A1* | 6/2017 | Yamanaka | ............. H05B 33/10 |
| 2017/0309698 | A1 | 10/2017 | Bower et al. | |
| 2019/0131491 | A1* | 5/2019 | Lee | ......................... H01L 33/10 |
| 2019/0333964 | A1* | 10/2019 | Lee | ....................... H01L 33/505 |

(Continued)

FOREIGN PATENT DOCUMENTS

| CN | 110048305 A | 7/2019 |
|---|---|---|
| CN | 112213879 A | 1/2021 |

(Continued)

*Primary Examiner* — Joe E. Schoenholtz
(74) *Attorney, Agent, or Firm* — Lewis Roca Rothgerber Christie LLP

(57) ABSTRACT

According to some embodiments of the present disclosure, there is provided a display device including a substrate, a light emitting element on the substrate and emitting first light, a wavelength conversion layer on the light emitting element and including wavelength conversion particles for converting the first light into second light, a first selective transmission film between the light emitting element and the wavelength conversion layer and reflecting the first light and the second light, which are incident from the wavelength conversion layer, and a second selective transmission film on the wavelength conversion layer and reflecting the first light incident from the wavelength conversion layer and transmitting the second light.

20 Claims, 36 Drawing Sheets

(56) References Cited

U.S. PATENT DOCUMENTS

| | | | | |
|---|---|---|---|---|
| 2020/0284401 A1* | 9/2020 | Lenef | ................... | G03B 21/204 |
| 2021/0384381 A1* | 12/2021 | Zhang | .................... | H01L 33/46 |
| 2023/0155057 A1* | 5/2023 | Kreiner | .................. | H01L 33/10 |
| | | | | 257/79 |
| 2023/0317892 A1* | 10/2023 | Mezouari | ................ | H01L 33/10 |
| | | | | 257/79 |
| 2023/0361252 A1* | 11/2023 | Zhu | ........................ | H01L 33/10 |
| 2024/0021762 A1* | 1/2024 | Jeon | ........................ | H01L 33/46 |

FOREIGN PATENT DOCUMENTS

| | | | |
|---|---|---|---|
| JP | 2010040976 A | * | 2/2010 |
| KR | 2018-0133649 A | | 12/2018 |

\* cited by examiner

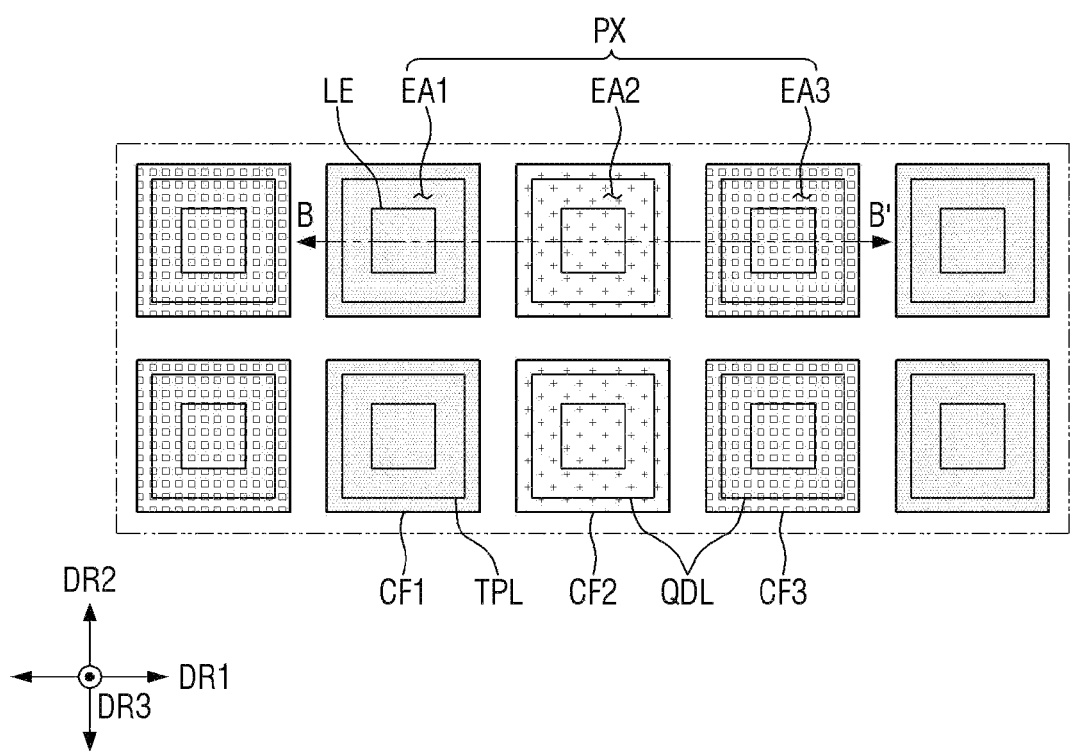

FIG. 4D
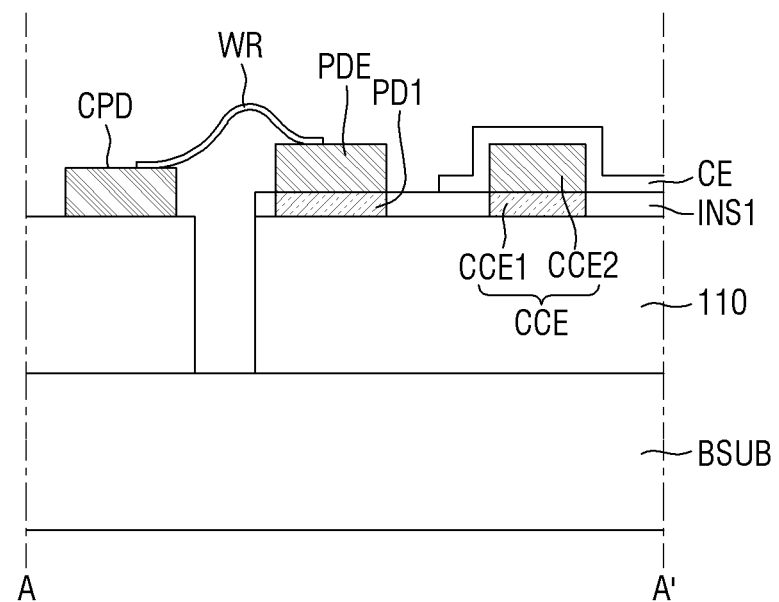
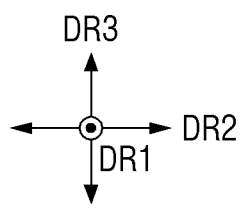

FIG. 5
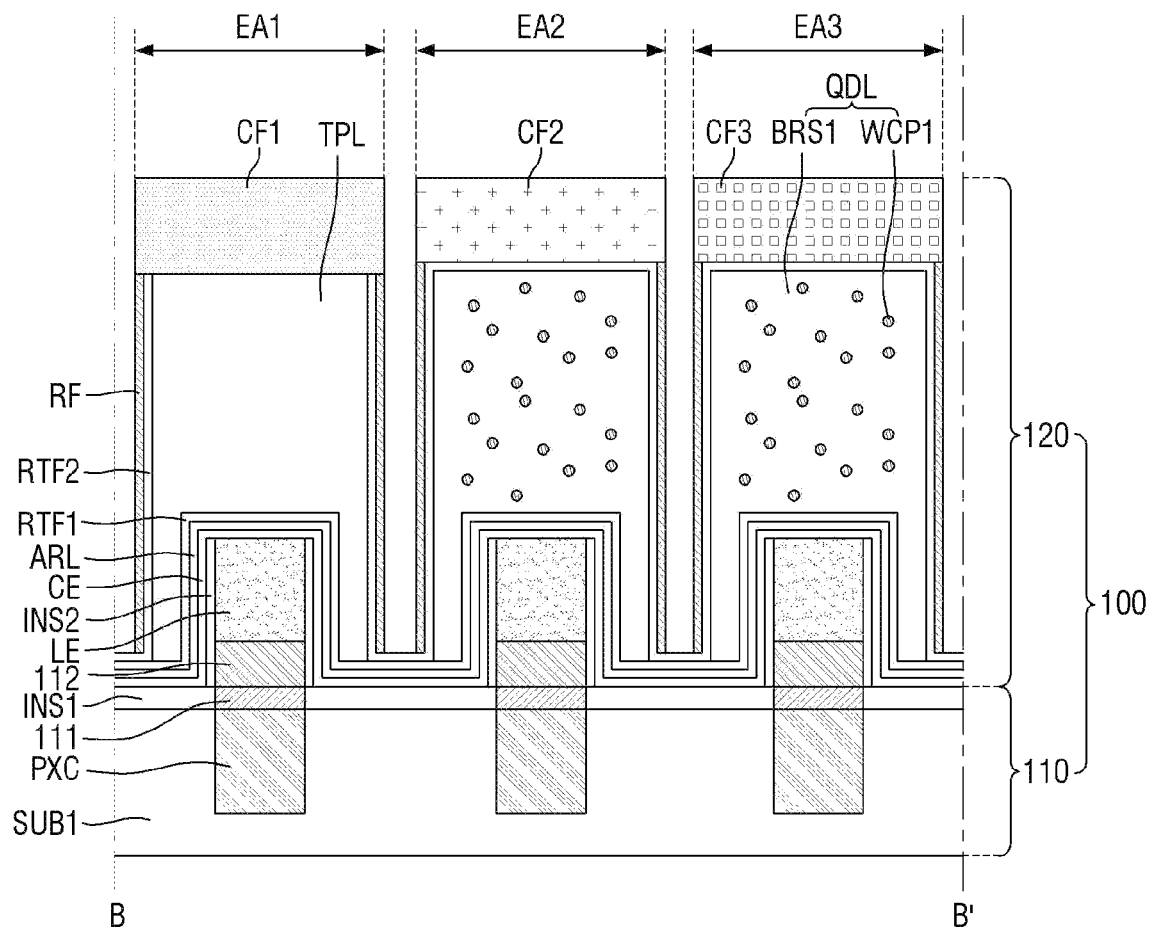
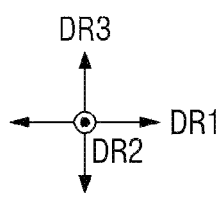

FIG. 20
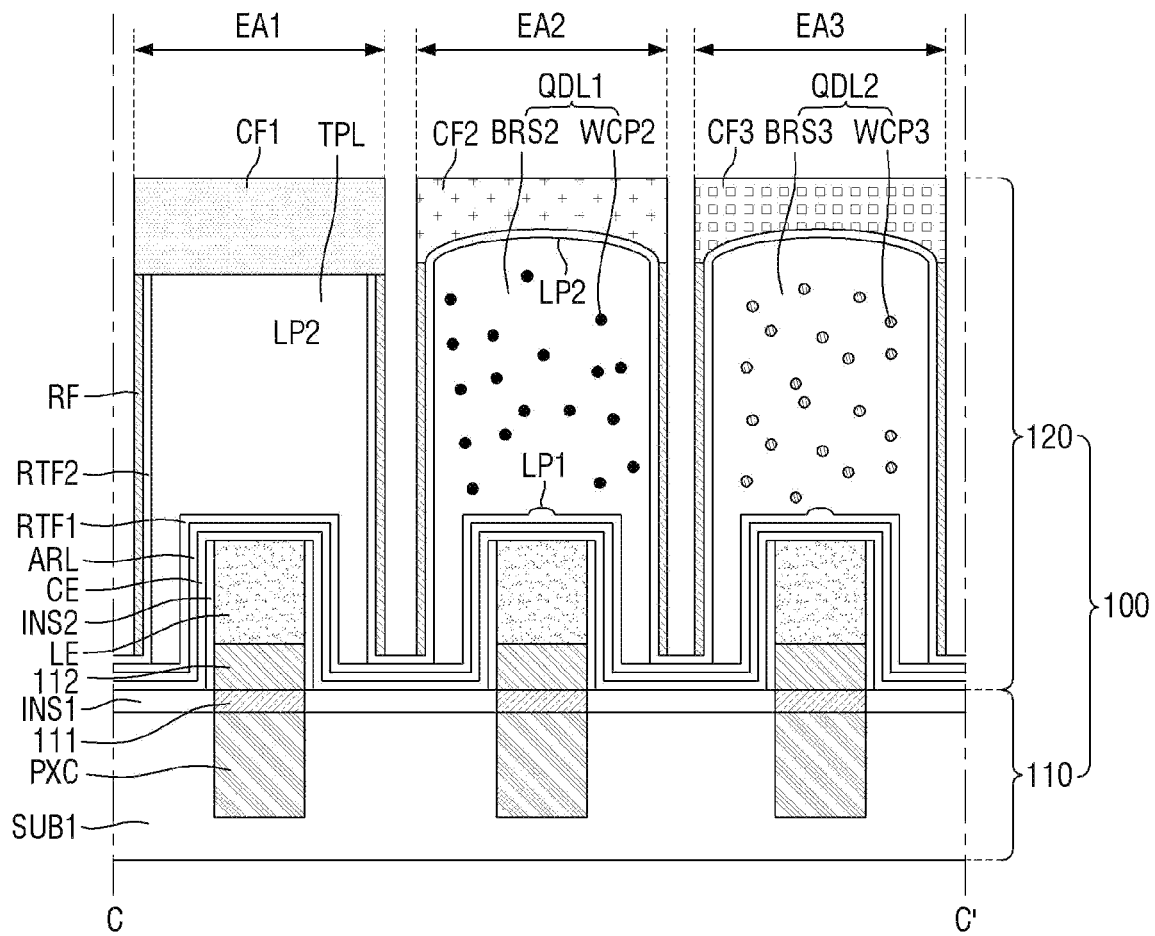
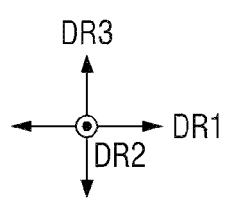

DISPLAY ELEMENT WITH NOVEL REFLECTORS

CROSS-REFERENCE TO RELATED APPLICATION

This application claims priority to, and the benefit of, Korean Patent Application No. 10-2021-0056298 filed on Apr. 30, 2021, in the Korean Intellectual Property Office (KIPO), the entire content of which is hereby incorporated by reference.

BACKGROUND

1. Field

One or more embodiments, of the present disclosure relate to a display device.

2. Description of the Related Art

With the advancement of the information age, the demand for a display device of various forms for displaying an image has increased. The display device may be a flat panel display device such as a liquid crystal display device, a field emission display device, and/or a light emitting display panel. The light emitting display device may include an organic light emitting display device including an organic light emitting diode element as a light emitting element, an inorganic light emitting display device including an inorganic semiconductor element as a light emitting element, and/or a micro light emitting diode element as a light emitting element.

Recently, a head mounted display including a light emitting display device has been developed. The head mounted display (HMD) is a monitor device for a virtual reality (VR) and/or augmented reality (AR) experience, which is worn by a user in the form of glasses or helmet and forms a focus at a distance close to the eyes of the user.

A high-resolution micro light emitting diode display panel including a micro light emitting diode element is applied to a head mounted display. In order to prevent or reduce the mixing of light emitted from the micro light emitting diode element with light emitted from another micro light emitting diode element adjacent thereto, a partition may be provided between the adjacent micro light emitting diode elements. However, because a width of the partition should be reduced due to high integration (e.g., high density) of the micro light emitting diode elements, it may be difficult to fabricate the partition.

SUMMARY

One or more aspects of one or more embodiments of the present disclosure are directed toward a display device in which the mixing of light from light emitting diodes adjacent to each other may be prevented or reduced without requiring a separate partition.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to some embodiments of the present disclosure, there is provided a display device including a substrate, a light emitting element on the substrate to emit first light, a wavelength conversion layer on the light emitting element and including wavelength conversion particles to convert the first light into second light, a first selective transmission film between the light emitting element and the wavelength conversion layer to reflect the first light and the second light, which are incident from the wavelength conversion layer, and a second selective transmission film on the wavelength conversion layer to reflect the first light incident from the wavelength conversion layer and to transmit the second light.

The first selective transmission film may include a first sub-selective transmission film to reflect the first light incident from the wavelength conversion layer and to transmit the second light, and a second sub-selective transmission film to reflect the second light incident from the wavelength conversion layer and to transmit the first light.

The first sub-selective transmission film may include a plurality of first odd numbered layers having a first refractive index and a plurality of first even numbered layers having a second refractive index lower than the first refractive index, and the plurality of first odd numbered layers and the plurality of first even numbered layers are alternately arranged with each other in a thickness direction of the substrate.

An uppermost layer of the plurality of first even numbered layers may be in contact with the wavelength conversion layer.

The second sub-selective transmission film may include a plurality of second odd numbered layers having a first refractive index and a plurality of second even numbered layers having a second refractive index higher than the first refractive index, and the plurality of second odd numbered layers and the plurality of second even numbered layers are alternately arranged with each other in a thickness direction of the substrate.

An uppermost layer of the plurality of second even numbered layers may be in contact with the first sub-selective transmission film.

The second selective transmission film may include a plurality of third odd numbered layers having a first refractive index and a plurality of third even numbered layers having a second refractive index higher than the first refractive index, and the plurality of third odd numbered layers and the plurality of third even numbered layers are alternately arranged with each other in a thickness direction of the substrate.

The layer on the lowest portion of the plurality of third odd numbered layers may be in contact with the wavelength conversion layer.

The display device may further include a color filter on the second selective transmission film, to block, absorb, or reduce the first light and to transmit at least a portion of the second light.

The first selective transmission film may include a first optical pattern, and the second selective transmission film may include a second optical pattern.

Each of the first optical pattern and the second optical pattern may be convex toward an upper direction.

An area of the first optical pattern may be smaller than an area of the second optical pattern.

A curvature radius of the first optical pattern may be smaller than a curvature radius of the second optical pattern.

An area of the first optical pattern may be smaller than an area of the light emitting element.

An area of the second optical pattern may be greater than an area of the light emitting element.

The first optical pattern may be convex toward an upper direction, and the second optical pattern may be convex toward a lower direction.

According to some embodiments of the present disclosure, there is provided a display device including a light emitting element in each of a first light emitting area to emit first light, a second light emitting area to emit second light, and a third light emitting area to emit third light, a light transmitting layer on the light emitting element in the first light emitting area, a wavelength conversion layer on the light emitting element in each of the second light emitting area and the third light emitting area, a first selective transmission film between the light emitting element and the wavelength conversion layer in each of the first light emitting area, the second light emitting area and the third light emitting area, and a second selective transmission film on the wavelength conversion layer in the second light emitting area. The first selective transmission film may be to reflect the first light and the second light, which are incident from the wavelength conversion layer. The second selective transmission film may be to reflect the first light incident from the wavelength conversion layer and to transmit the second light.

The display device may further include the second selective transmission film on the wavelength conversion layer in the third light emitting area. The second selective transmission film in the third light emitting area may be to transmit the third light incident from the wavelength conversion layer.

The display device may further include a first color filter on the light transmitting layer in the first light emitting area, to transmit the first light, and to block, absorb, or reduce the second light and the third light, a second color filter on the wavelength conversion layer in the second light emitting area, to transmit the second light, and to block, absorb, or reduce the first light and the third light, and a third color filter on the wavelength conversion layer in the third light emitting area, to transmit the third light, and to block, absorb, or reduce the first light and the second light.

According to some embodiments of the present disclosure, there is provided a display device including a light emitting element in each of a first light emitting area to emit first light, a second light emitting area to emit second light, and a third light emitting area to emit third light, a light transmitting layer on the light emitting element in the first light emitting area, a wavelength conversion layer on the light emitting element in each of the second light emitting area and the third light emitting area, a first selective transmission film between the light emitting element and the wavelength conversion layer in at least one of the first light emitting area, the second light emitting area, or the third light emitting area, the first selective transmission film including a first optical pattern overlapping the light emitting element, and a second optical pattern on the wavelength conversion layer in at least one of the first light emitting area, the second light emitting area, or the third light emitting area, the second optical pattern overlapping the first optical pattern. The second optical pattern has a curvature radius greater than a curvature radius of the first optical pattern.

According to the aforementioned and other embodiments of the present disclosure, a light transmitting layer is on an upper surface and sides of a light emitting element in each of first light emitting areas, and a wavelength conversion layer is on the upper surface and sides of the light emitting element in each of second light emitting areas and third light emitting areas. Further, a reflection film is on sides of the light transmitting layer in each of the first light emitting areas and sides of the wavelength conversion layer in each of the second light emitting areas and the third light emitting areas. Therefore, light moving to upper and lower sides and left and right sides, rather than in an upper direction, among light emitted from the light emitting element may be reflected by the reflection film. Therefore, even though a separate partition is not provided between light emitting elements of adjacent light emitting areas, mixing of light emitted from the light emitting elements of the adjacent light emitting areas may be prevented or reduced.

According to the aforementioned and other embodiments of the present disclosure, a first selective transmission film and a second selective transmission film reflect first light that is not converted by first wavelength conversion particles of a wavelength conversion layer among first light emitted from the light emitting element in each of the second light emitting areas and the third light emitting areas. Also, the first selective transmission film reflects fourth light converted by the first wavelength conversion particles among the first light emitted from the light emitting element in each of the second light emitting areas and the third light emitting areas. Therefore, due to the first selective transmission film and the second selective reflection film, efficiency of the first light emitted from the light emitting element and converted into the fourth light by the first wavelength conversion particles of the wavelength conversion layer may be enhanced, and efficiency of the fourth light converted by the first wavelength conversion particles and output through a second color filter or a third color filter may be enhanced.

According to the aforementioned and other embodiments of the present disclosure, because the second selective transmission film reflects first light that is not converted by the first wavelength conversion particles of the wavelength conversion layer and transmits fourth light converted by a first wavelength conversion layer, a second optical pattern may serve as a reflection member, such as a concave mirror, for the first light. Also, because the first selective transmission film reflects the fourth light converted by the first wavelength conversion layer as well as the first light that is not converted by the first wavelength conversion particles of the wavelength conversion layer, a first optical pattern may serve as a reflection member convex for the first light and the fourth light. Therefore, because a path of the light is lengthened in the wavelength conversion layer due to the second optical pattern and the first optical pattern, efficiency of the light converted into the fourth light by the first wavelength conversion particles of the wavelength conversion layer may be enhanced, and efficiency of the fourth light converted by the first wavelength conversion particles and output through a second color filter or a third color filter may be enhanced.

According to the aforementioned and other embodiments of the present disclosure, because the first optical pattern covers most of an upper surface of the light emitting element, the first optical pattern may serve as a convex lens for the first light emitted from the light emitting element. Therefore, the first light emitted from the light emitting element may be focused on a first focal point positioned at a first focal distance by the first selective transmission film. Because the second selective transmission film reflects the first light that is not converted by the first wavelength conversion particles of the wavelength conversion layer and transmits the fourth light converted by the first wavelength conversion layer, the second optical pattern may serve as a convex lens for the fourth light. Therefore, the fourth light converted by a first wavelength conversion member of the wavelength conversion layer may be emitted as parallel light in a third direction by the second optical pattern positioned at a second focal distance from the first focal point. Therefore, a ratio of the light emitted to a front surface in comparison with a side of the display device may be increased by the first optical pattern and the second optical pattern.

BRIEF DESCRIPTION OF THE DRAWINGS

The above and other embodiments and features of the present disclosure will become more apparent by describing embodiments thereof with reference to the attached drawings, in which:

FIG. 3 is a plan view illustrating pixels of a display panel according to one or more embodiments of the present disclosure;

FIG. 4D is a cross-sectional view illustrating an example of a display panel taken along line A-A' of FIG. 2;

FIG. 5 is a cross-sectional view illustrating an example of a display panel taken along line B-B' of FIG. 3;

FIG. 20 is a cross-sectional view illustrating another example of a display panel taken along line C-C' of FIG. 15;

DETAILED DESCRIPTION

Figure 1:
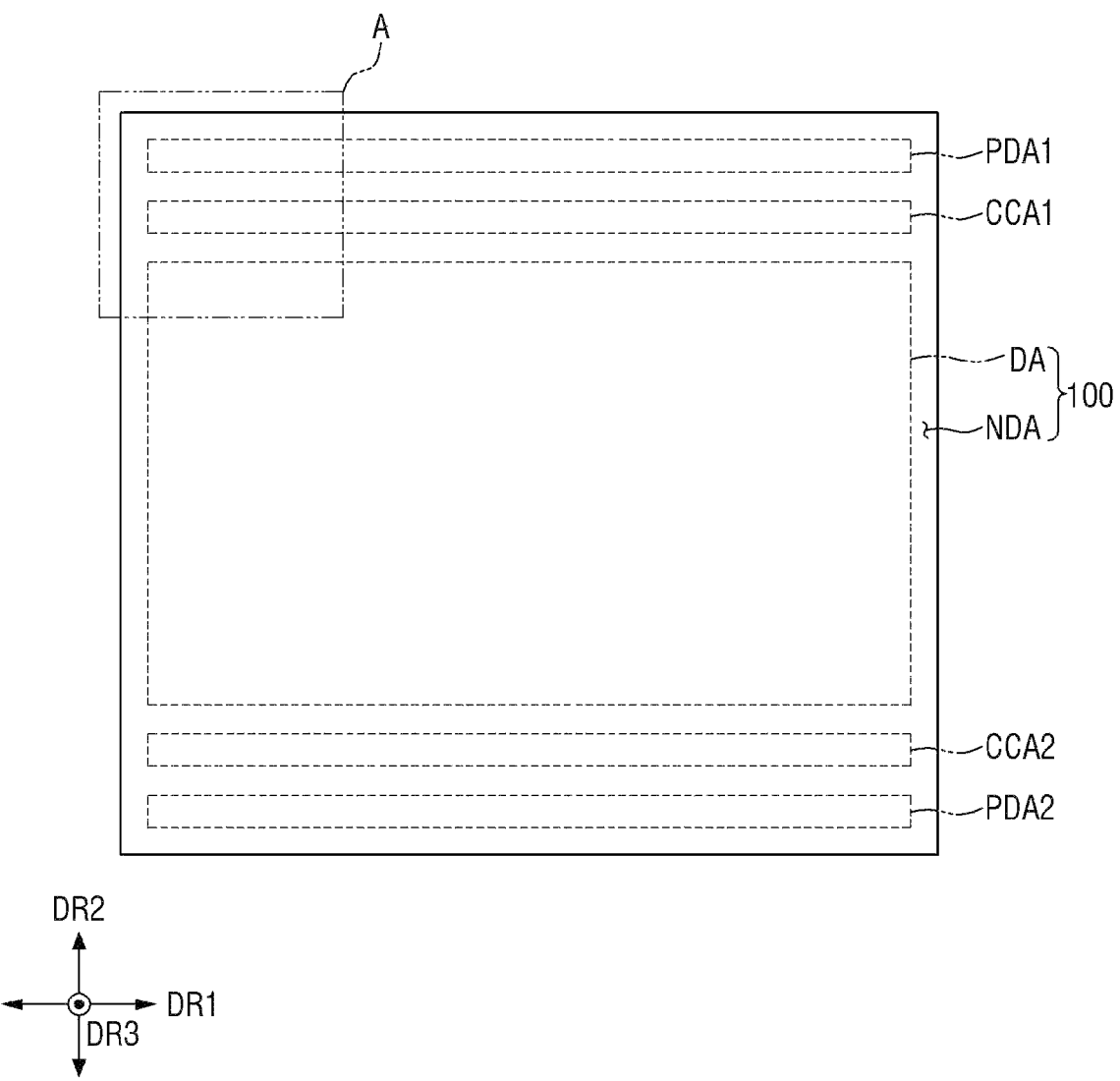
FIG. 1 is a plan view of a display device according to one or more embodiments of the present disclosure.

One or more aspects of one or more embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure might not be described.

Unless otherwise noted, like reference numerals, characters, or combinations thereof denote like elements throughout the attached drawings and the written description, and thus, descriptions thereof will not be repeated. Further, parts not related to the description of some embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It should be apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component therebetween. Other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," "one of," "at least one selected from," and the like, when preceding a list of elements, modify the entire list of elements and do not modify the individual elements of the list. For example, "at least one of X, Y, and/or Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and/or B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to or different from the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of some embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

As used herein, "plane shape" may refer to a shape of an element when viewed in plan view.

Figure 2:
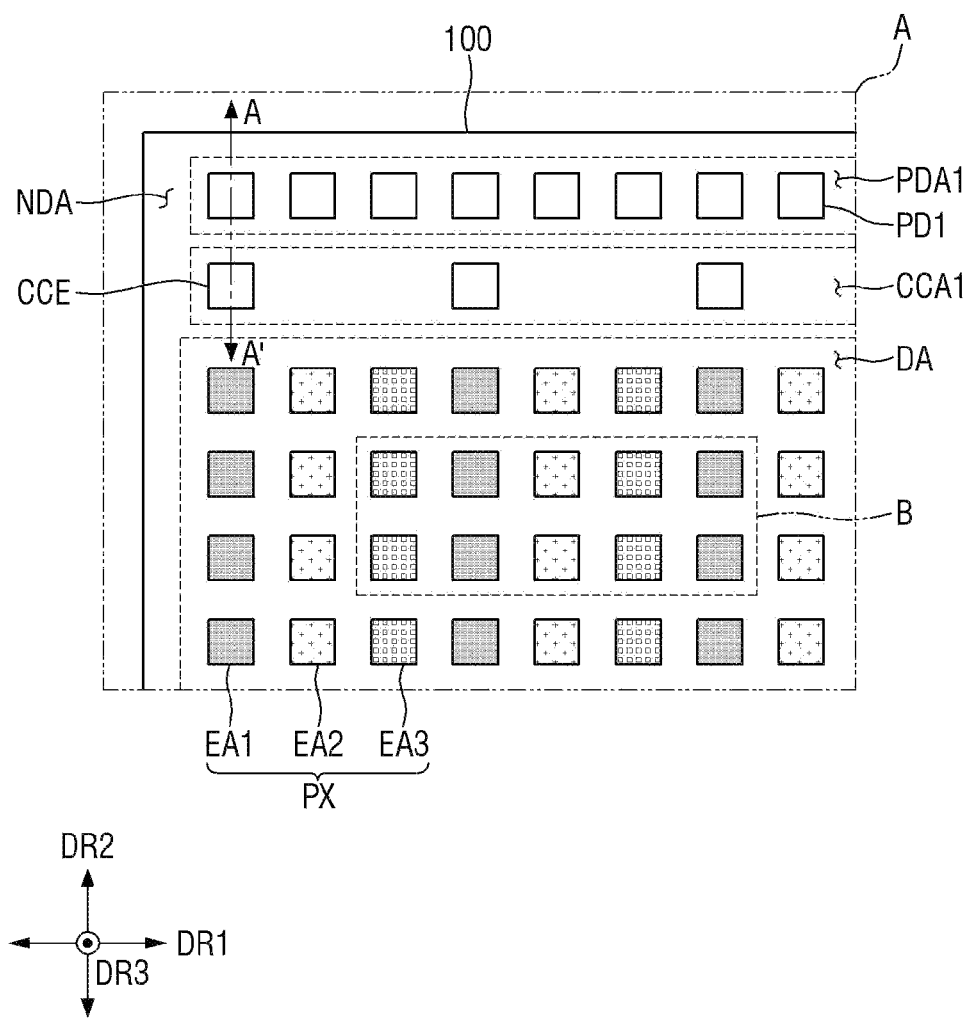
FIG. 2 is an enlarged plan view illustrating an area A of FIG. 1.

FIG. 1 is a plan layout view of a display device according to one or more embodiments of the present disclosure. FIG. 2 is an enlarged plan view illustrating an area A of FIG. 1. FIG. 3 is a plan view illustrating pixels of a display panel according to one or more embodiments of the present disclosure.

Although the display device according to one or more embodiments of the present disclosure is a micro light emitting diode display device (or nano light emitting diode display device) including a micro light emitting diode as a light emitting element LE in FIGS. 1 to 3, the embodiment of the present disclosure is not limited thereto.

Although the display device according to one or more embodiments of the present disclosure is a light emitting diode on Silicon (LEDoS) having light emitting diodes on a semiconductor circuit board 110 formed by a semiconductor process using a silicon wafer, as light emitting elements in FIGS. 1 to 3, the embodiment of the present disclosure is not limited thereto.

In addition, in FIGS. 1 to 3, a first direction DR1 indicates a horizontal direction of a display panel 100, a second direction DR2 indicates a vertical direction of the display panel 100, and a third direction DR3 indicates a thickness direction of the display panel 100 or a thickness direction of the semiconductor circuit board 110. In this case, "left," "right," "up," and "down," indicate directions when the display panel 100 is viewed from the plane (e.g., in plan view). For example, "right" indicates one side of the first direction DR1, "left" indicates the other side of the first direction DR1, "upper" indicates one side of the second direction DR2, and "lower" indicates the other side of the second direction DR2. In addition, "upper" indicates one side of the third direction DR3, and "lower" indicates the other side of the third direction DR3.

Referring to FIGS. 1 to 3, the display device 10 according to one or more embodiments includes a display panel 100 including a display area DA and a non-display area NDA.

The display panel 100 may have a rectangular plane shape having a long side of the first direction DR1 and a short side of the second direction DR2, but the plane shape of the display panel 100 is not limited thereto, and may have another suitable polygonal shape, or may have a circular shape, an oval shape, or an irregular plane shape.

The display area DA may be an area where an image is displayed, and the non-display area NDA may be an area where an image is not displayed. The plane shape of the display area DA may follow the plane shape of the display panel 100. In the example of FIG. 1, the plane shape of the display area DA is a rectangular shape. The display area DA may be in a central area of the display panel 100. The non-display area NDA may be in the vicinity of the display area DA. The non-display area NDA may surround the display area DA.

The display area DA of the display panel 100 may include a plurality of pixels PX. The pixels PX may be defined as a minimum light emission unit capable of displaying white light.

Each of the plurality of pixels PX may include a plurality of light emitting areas EA1, EA2 and EA3 that emit light. In the embodiment of the present disclosure, each of the plurality of pixels PX includes three light emitting areas EA1, EA2 and EA3, but is not limited thereto. For example, each of the plurality of pixels PX may include four light emitting areas. Each of the plurality of light emitting areas EA1, EA2 and EA3 may include a light emitting element LE for emitting first light.

Figure 4A:
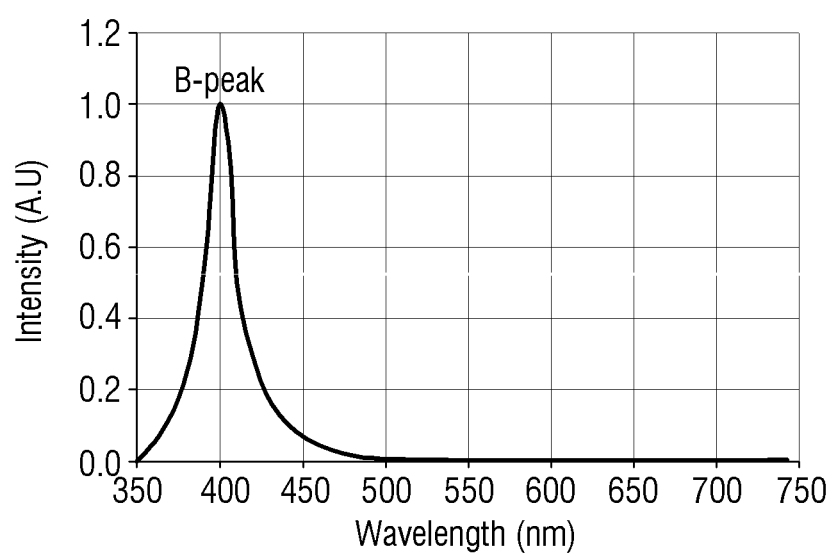
FIGS. 4A-4C show graphs illustrating an example of each of a main peak wavelength of first light, a main peak wavelength of second light, and a main peak wavelength of third light.

Each of the first light emitting areas EA1 indicates an area for emitting the first light. Each of the first light emitting areas EA1 may output the first light output from the light emitting element LE as it is. The first light may be the light of a blue wavelength band. For example, a main peak wavelength (B-peak) of the first light may be in a range from 370 nm to 460 nm, approximately, as shown in FIG. 4A, but the embodiments of the present disclosure are not limited thereto.

Figure 4B:
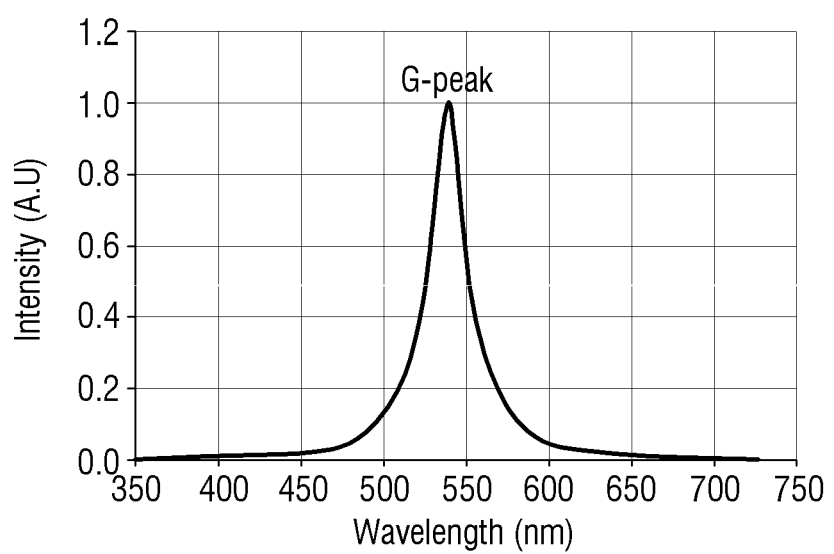

Each of the second light emitting areas EA2 indicates an area for emitting second light. Each of the second light emitting areas EA2 may convert a portion of the first light output from the light emitting element LE into the second light and output the second light. The second light may be the light of a green wavelength band. For example, a main peak wavelength (G-peak) of the second light may be in a range from 480 nm to 560 nm, approximately, as shown in FIG. 4B, but the embodiments of the present disclosure are not limited thereto.

Figure 4C:
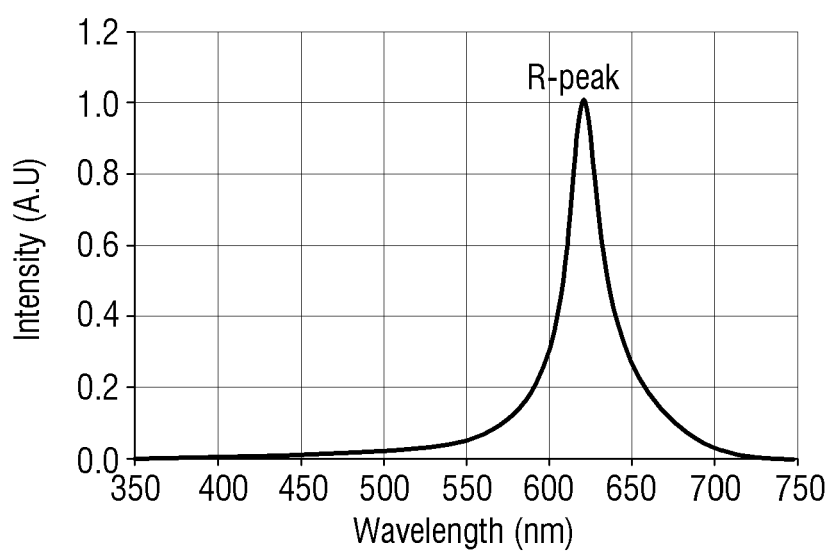

Each of the third light emitting areas EA3 indicates an area for emitting third light. Each of the third light emitting areas EA3 may convert a portion of the first light output from the light emitting element LE into the third light and output the third light. The third light may be the light of a red wavelength band. For example, a main peak wavelength (R-peak) of the third light may be in a range from 600 nm to 750 nm, approximately, as shown in FIG. 4C, but the embodiments of the present disclosure are not limited thereto.

The first light emitting areas EA1, the second light emitting areas EA2, and the third light emitting areas EA3 may be arranged alternately with each other in the first direction DR1. For example, the first light emitting areas EA1, the second light emitting areas EA2, and the third light emitting areas EA3 may be arranged in the first direction DR1 in due order.

The first light emitting areas EA1 may be arranged in the second direction DR2 with each other. The second light emitting areas EA2 may be arranged in the second direction DR2 with each other. The third light emitting areas EA3 may be arranged in the second direction DR2 with each other.

Each of the first light emitting areas EA1 may include a light emitting element LE, a light transmitting layer TPL, and a first color filter CF1. The light emitting element LE, the light transmitting layer TPL, and the first color filter CF1 may overlap one another in the third direction DR3. The light transmitting layer TPL may transmit the first light output from the light emitting element LE as it is, and the first color filter CF1 may transmit the first light. Therefore, each of the first light emitting areas EA1 may emit the first light.

Each of the second light emitting areas EA2 may include a light emitting element LE, a wavelength conversion layer QDL, and a second color filter CF2. The light emitting element LE, the wavelength conversion layer QDL, and the second color filter CF2 may overlap one another in the third direction DR3. The wavelength conversion layer QDL may convert a portion of the first light output from the light emitting element LE into fourth light, and may emit the fourth light. For example, the fourth light may be the light of a yellow wavelength band. The fourth light may include both a green wavelength band and a red wavelength band. For example, the fourth light may be the mixture light of the second light and the third light. The second color filter CF2 may transmit the second light. Therefore, each of the second light emitting areas EA2 may emit the second light.

Each of the third light emitting areas EA3 may include a light emitting element LE, a wavelength conversion layer QDL, and a third color filter CF3. The light emitting element LE, the wavelength conversion layer QDL, and the third color filter CF3 may overlap one another in the third direction DR3. The wavelength conversion layer QDL may convert a portion of the first light output from the light emitting element LE into the fourth light, and may emit the fourth light. The third color filter CF3 may transmit the third light. Therefore, each of the third light emitting areas EA3 may emit the third light.

Each of an area of the light transmitting layer TPL and an area of the wavelength conversion layer QDL may be greater than that of the light emitting element LE. An area of each of the first color filter CF1, the second color filter CF2 and the third color filter CF3 may be greater than that of the light emitting element LE. In addition, the area of each of the first color filter CF1, the second color filter CF2 and the third color filter CF3 may be greater than each of the area of the light transmitting layer TPL and the area of the wavelength conversion layer QDL.

In the light emitting area EA1, the light emitting element LE may completely be covered by the light transmitting layer TPL, and the light transmitting layer TPL may completely be covered by the first color filter CF1. In the second light emitting area EA2, the light emitting element LE may completely be covered by the wavelength conversion layer QDL, and the wavelength conversion layer QDL may completely be covered by the second color filter CF2. In the third light emitting area EA3, the light emitting element LE may completely be covered by the wavelength conversion layer QDL, and the wavelength conversion layer QDL may completely be covered by the third color filter CF3.

A plane shape of the light transmitting layer TPL, a plane shape of the wavelength conversion layer QDL, a plane shape of the first color filter CF1, a plane shape of the second color filter CF2, and a plane shape of the third color filter CF2 may follow the plane shape of the light emitting element LE. For example, when the light emitting element LE has a rectangular plane shape, each of the light transmitting layer TPL, the wavelength conversion layer QDL, the first color filter CF1, the second color filter CF2, and the third color filter CF3 may have a rectangular plane shape. In one or more embodiments, the light emitting element LE may have a polygonal shape other than the rectangular shape, or may have a circular shape, an oval shape, or an irregular shape. In this case, the light transmitting layer TPL, the wavelength conversion layer QDL, the first color filter CF1, the second color filter CF2, and the third color filter CF3 may also have a polygonal shape other than the rectangular shape, a circular shape, an oval shape, or an irregular shape.

In one or more embodiments, the plane shape of the light transmitting layer TPL, the plane shape of the wavelength conversion layer QDL, the plane shape of the first color filter CF1, the plane shape of the second color filter CF2, and the plane shape of the third color filter CF3 may not follow the plane shape of the light emitting element LE. In this case, the plane shape of the light transmitting layer TPL, the plane shape of the wavelength conversion layer QDL, the plane shape of the first color filter CF1, the plane shape of the second color filter CF2, and the plane shape of the third color filter CF3 may be different from the plane shape of the light emitting element LE. In one or more embodiments, each of the plane shape of the light transmitting layer TPL and the plane shape of the wavelength conversion layer QDL may be different from each of the plane shape of the first color filter CF1, the plane shape of the second color filter CF2, and the plane shape of the third color filter CF3.

The non-display area NDA may include a first common connection area CCA1, a second common connection area CCA2, a first pad area PDA1, and a second pad area PDA2.

The first common connection area CCA1 may be between the first pad area PDA1 and the display area DA. The second common connection area CCA2 may be between the second pad area PDA2 and the display area DA. Each of the first common connection area CCA1 and the second common connection area CCA2 may include a plurality of common connection electrodes CCE connected (e.g., coupled) to a common electrode (CE of FIG. 4D). As a result, the common voltage may be supplied to the common electrode (CE of FIG. 4D) through the plurality of common connection electrodes (CCE). The plurality of common connection electrodes CCE of the first common connection area CCA1 may electrically be connected (e.g., electrically coupled) to any one of first pads PD1 of the first pad area PDA1. The plurality of common connection electrodes CCE of the second common connection area CCA2 may electrically be connected (e.g., electrically coupled) to any one of second pads PD2 of the second pad area PDA2.

The first pad area PDA1 may be above the display panel 100. The first pad area PDA1 may include the first pads PD1 connected to an external circuit board (CB of FIG. 4D).

The second pad area PDA2 may be below the display panel 100. The second pad area PDA2 may include second pads for connection with the external circuit board (CB of FIG. 4D). In one or more embodiments, the second pad area PDA2 may be omitted.

Figure 6:
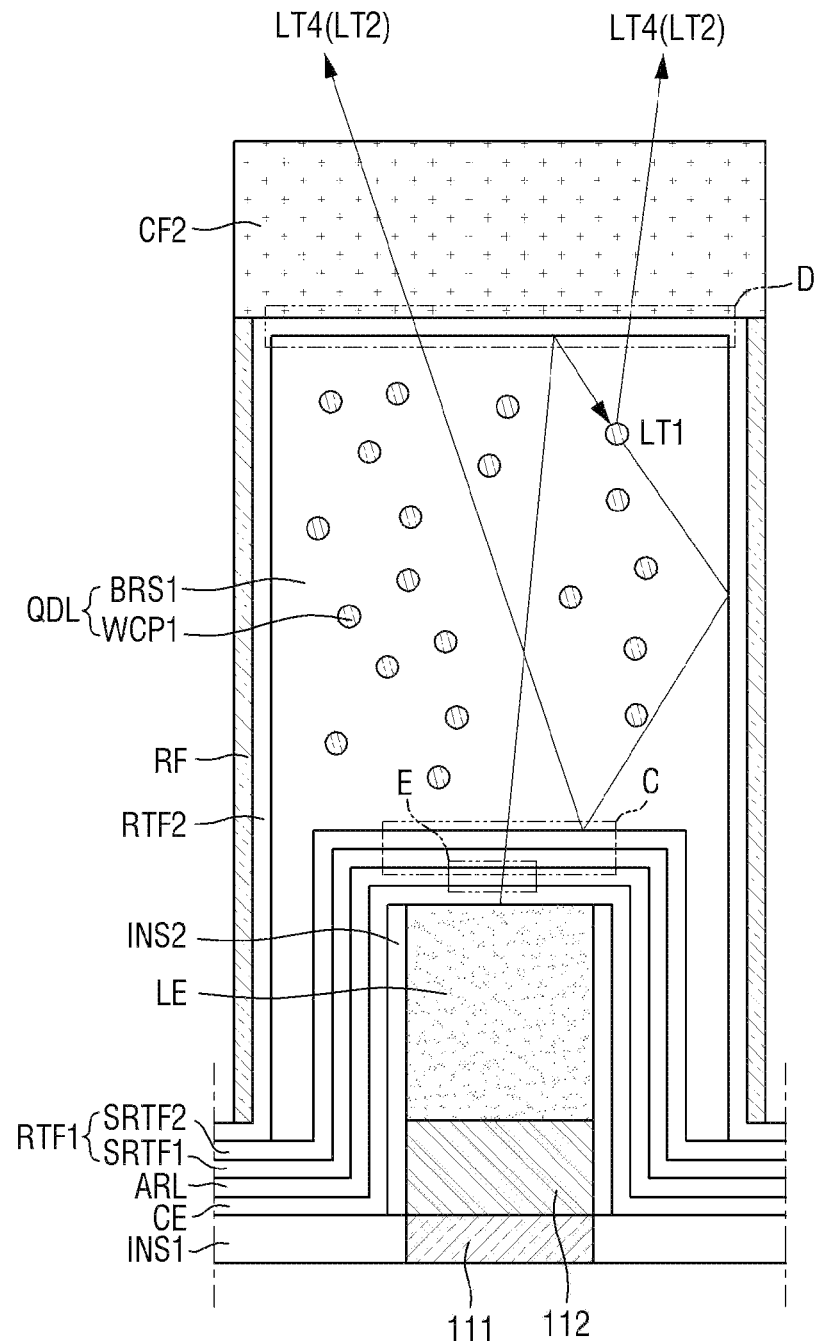
FIG. 6 is an enlarged cross-sectional view illustrating a light emitting element, a wavelength conversion layer, an anti-reflection layer, a first selective reflection film, a second selective reflection film, and a second color filter of a second light emitting area of FIG. 5.
Figure 7:
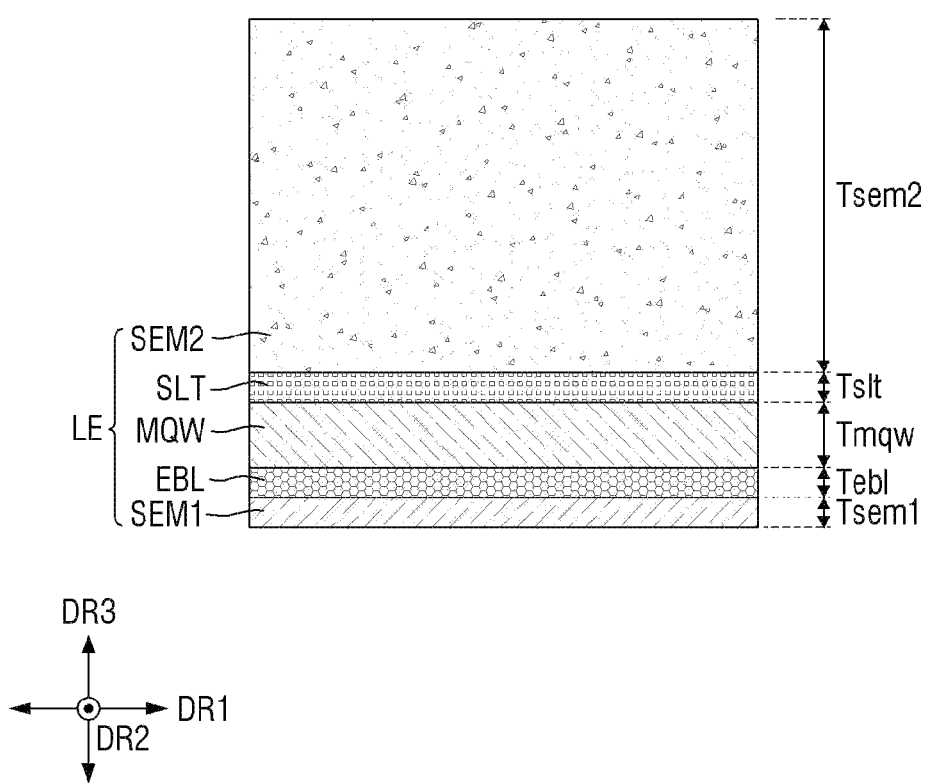
FIG. 7 is an enlarged cross-sectional view illustrating an example of a light emitting element of FIG. 5.

FIG. 4D is a cross-sectional view illustrating an example of a display panel taken along line A-A' of FIG. 2. FIG. 5 is a cross-sectional view illustrating an example of a display panel taken along line B-B' of FIG. 3. FIG. 6 is an enlarged cross-sectional view illustrating a light emitting element, a wavelength conversion layer, an anti-reflection layer, a first selective reflection film, a second selective reflection film, and a second color filter of a second light emitting area of FIG. 5. FIG. 7 is an enlarged cross-sectional view illustrating an example of a light emitting element of FIG. 5.

Referring to FIGS. 4B to 7, the display panel 100 may include a semiconductor circuit board 110 and a light emitting element layer 120.

The semiconductor circuit board 110 may include a first substrate SUB1, a plurality of pixel circuit areas PXC, pixel electrodes 111, first pads PD1, first common connection electrodes CCE1 of common connection electrodes CCE, and a first insulating film INS1.

The first substrate SUB1 may be a silicon wafer substrate. The first substrate SUB1 may be made of single crystalline silicon (e.g., monocrystalline silicon).

Each of the plurality of pixel circuit areas PXC may be on the first substrate SUB1. Each of the plurality of pixel circuit areas PXC may include a complementary metal-oxide semiconductor (CMOS) circuit formed using a suitable semiconductor process. Each of the plurality of pixel circuit areas PXC may include at least one transistor formed by the semiconductor process. Each of the plurality of pixel circuit areas PXC may further include at least one capacitor formed by the semiconductor process.

The plurality of pixel circuit areas PXC may be in the display area DA. Each of the plurality of pixel circuit areas PXC may be connected (e.g., electrically and/or physically coupled) to a corresponding pixel electrode 111. For example, the plurality of pixel circuit areas PXC and the plurality of pixel electrodes 111 may be connected to each other in a one-to-one correspondence. Each of the pixel circuit areas PXC may apply a pixel voltage or an anode voltage to one pixel electrode 111.

Each of the pixel electrodes 111 may be positioned on a corresponding pixel circuit area PXC. Each of the pixel electrodes 111 may be an exposed electrode exposed from the pixel circuit area PXC. For example, each of the pixel electrodes 111 may protrude from an upper surface of the pixel circuit area PXC. Each of the pixel electrodes 111 may be formed integrally with the pixel circuit area PXC. Each of the pixel electrodes 111 may be supplied with a pixel voltage or an anode voltage from the pixel circuit area PXC. The pixel electrodes 111 may include aluminum (Al).

Each of the first pads PD1 and the first common connection electrodes CCE1 may be an exposed electrode exposed from the first substrate SUB1. The first pad PDA1 and the first common connection electrode CCE1 may include the same material as the pixel electrodes 111. For example, the first pad PD1 and the first common connection electrode CCE1 may include aluminum (Al).

Because the second pads of the second pad area PDA2 may substantially be the same as the second pads PD2 described with reference to FIG. 4D, their description will not be provided again.

The first insulating film INS1 may be on the first substrate SUB1 where the pixel electrodes 111, the first pads PD1, and the first common connection electrodes CCE1 are not provided. An upper surface of the first insulating film INS1, an upper surface of each of the pixel electrodes 111, an upper surface of each of the first pads PD1, and an upper surface of each of the first common connection electrodes CCE1 may be aligned with one another to be flat. In one or more other embodiments, the first insulating film INS1 may cover the pixel electrodes 111, the first pads PD1, and the first common connection electrodes CCE1. In this case, at least a portion of each of the pixel electrodes 111, the first pads PD1, and the first common connection electrodes CCE1 may be exposed without being covered by the first insulating film INS1 through a contact hole passing through the first insulating film INS1. The first insulating film INS1 may be formed of an inorganic film, such as a silicon oxide film ($SiO_2$), an aluminum oxide film ($Al_2O_3$), and/or a hafnium oxide film ($HfO_X$).

The light emitting element layer 120 may include a plurality of light emitting areas EA1, EA2, and EA3, and thus may be a layer that emits light. The light emitting element layer 120 may include connection electrodes 112, a pad connection electrode PDE, a second common connection electrode CCE2 of a common connection electrodes CCE, light emitting elements LE, a second insulating film INS2, a common electrode CE, a wavelength conversion layer QDL, a selective transmission film RTF, a reflection film RF, and a plurality of color filters CF1, CF2 and CF3.

Each of the connection electrodes 112 may be on a corresponding pixel electrode 111. For example, the connection electrodes 112 may be connected (e.g., electrically and/or physically coupled) to the pixel electrodes 111 in a one-to-one correspondence. The connection electrodes 112 may serve as a bonding metal to bond the pixel electrodes 111 with the light emitting elements LE in a fabricating process. For example, the connection electrodes 112 may include at least one of gold (Au), copper (Cu), aluminum (Al), and/or tin (Sn). In one or more embodiments, the connection electrodes 112 may include a first layer including any one of gold (Au), copper (Cu), aluminum (Al), and/or tin (Sn), and a second layer including the other one of gold (Au), copper (Cu), aluminum (Al), and/or tin (Sn). In this case, the second layer may be on the first layer.

The pad connection electrode PDE may be on the first pad PD1, and the second common connection electrode CCE2 may be on the first common connection electrode CCE1. The pad connection electrode PDE may be in contact with the upper surface of the first pad PD1, and the second common connection electrode CCE2 may be in contact with the upper surface of the first common connection electrode CCE1. The pad connection electrode PDE and the second common connection electrode CCE2 may include the same material as that of the connection electrodes 112. For example, each of the pad connection electrode PDE and the second common connection electrode CCE2 may include at least one of gold (Au), copper (Cu), aluminum (Al), and/or tin (Sn). When each of the connection electrodes 112 includes the first layer and the second layer, each of the pad connection electrode PDE and the second common connection electrode CCE2 may also include the first layer and the second layer.

The pad connection electrode PDE may be connected to a pad CPD of a circuit board CB through a conductive connection member such as a wire WR. For example, the first pad PD1, the pad connection electrode PDE, the wire WR, and the pad CPD of the circuit board CB may be electrically connected (e.g., electrically coupled) to one another.

The semiconductor circuit board 110 and the circuit board CB may be provided on a base substrate BSUB. The semiconductor circuit board 110 and the circuit board CB may be attached to an upper surface of the base substrate BSUB by an adhesive member such as a pressure sensitive adhesive.

The circuit board CB may be a flexible printed circuit board (FPCB), a printed circuit board (PCB), a flexible printed circuit (FPC), and/or a flexible film such as a chip on film (COF).

Each of the light emitting elements LE may be on the connection electrode 112. The light emitting element LE may be a vertical light emitting diode element extending in the third direction DR3. For example, a length of the light emitting element LE in the third direction DR3 may be longer than a length in a horizontal direction. The length in the horizontal direction indicates a length in the first direction DR1 or a length in the second direction DR2. For example, the length of the light emitting element LE in the third direction DR3 may be 1 μm to 5 μm, approximately.

The light emitting element LE may be a micro light emitting diode element or a nano light emitting diode. The light emitting element LE includes a first semiconductor layer SEM1, an electron blocking layer EBL, an active layer MQW, a superlattice layer SLT, and a second semiconductor layer SEM2 in the third direction DR3 as shown in FIG. 7. The first semiconductor layer SEM1, the electron blocking layer EBL, the active layer MQW, the superlattice layer SLT, and the second semiconductor layer SEM2 may sequentially be deposited in the third direction DR3.

The first semiconductor layer SEM1 may be on the connection electrode 112. The first semiconductor layer SEM1 may be doped with a first conductive type dopant such as Mg, Zn, Ca, Se, and/or Ba. For example, the first semiconductor layer SEM1 may be p-GaN doped with p-type Mg. A thickness Tsem1 of the first semiconductor layer SEM1 may be 30 nm to 200 nm, approximately.

The electron blocking layer EBL may be on the first semiconductor layer SEM1. The electron blocking layer EBL may be a layer for reducing, suppressing or preventing too many electrons from flowing to the active layer MQW. For example, the electron blocking layer EBL may be p-AlGaN doped with p-type Mg. A thickness Tebl of the electron blocking layer EBL may be 10 nm to 50 nm, approximately. In one or more embodiments, the electron blocking layer EBL may be omitted.

The active layer MQW may be on the electron blocking layer EBL. The active layer MQW may emit light by combination of electron-hole pairs in accordance with an electrical signal applied through the first semiconductor layer SEM1 and the second semiconductor layer SEM2. The active layer MQW may emit first light having a main peak wavelength band ranging from 450 nm to 495 nm, for example, light of a blue wavelength band.

The active layer MQW may include a single or multiple quantum well structure material. When the active layer MQW includes a multiple quantum well structure material, a plurality of well layers and a plurality of barrier layers may alternately be deposited. In this case, the well layer may be formed of, but not limited to, InGaN, and the barrier layer may be formed of, but not limited to, GaN and/or AlGaN. A thickness of each well layer may be 1 nm to 4 nm, approximately, and a thickness of each barrier layer may be 3 nm to 10 nm, approximately. A thickness Tmqw of the active layer MQW is a sum of the thickness of the well layers and the thickness of barrier layers.

In one or more embodiments, the active layer MQW may have a structure in which semiconductor materials having a large band gap energy and semiconductor materials having a low band gap energy are alternately deposited, and may include different group III to group V semiconductor materials depending on a wavelength band of light to be emitted. The light emitted from the active layer MQW may be second light (light of a green wavelength band) or third light (light of red wavelength band) as the case may be, without being limited to the first light (light of a blue wavelength band).

The superlattice layer SLT may be on the active layer MQW. The superlattice layer SLT may be a layer for mitigating or reducing stress between the second semiconductor layer SEM2 and the active layer MQW. For example, the superlattice layer SLT may be formed of InGaN and/or GaN. A thickness Tslt of the superlattice layer SLT may be 50 nm to 200 nm, approximately. In one or more embodiments, the superlattice layer SLT may be omitted.

The second semiconductor layer SEM2 may be on the superlattice layer SLT. The second semiconductor layer SEM2 may be doped with a second conductive type dopant such as Si, Ge and/or Sn. For example, the second semiconductor layer SEM2 may be n-GaN doped with n-type Si. A thickness Tsem2 of the second semiconductor layer SEM2 may be 500 nm to 1 μm, approximately.

Figure 17:
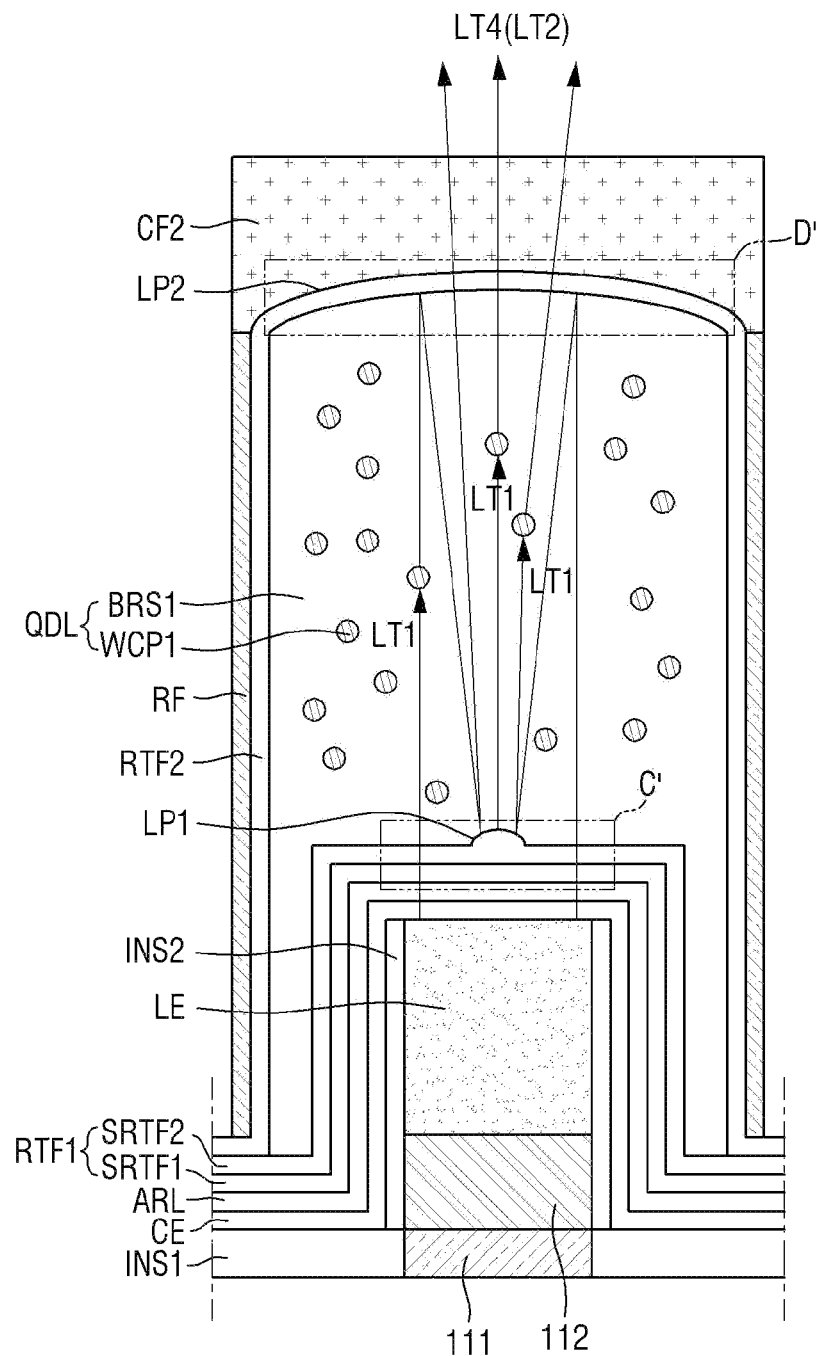
FIG. 17 is an enlarged cross-sectional view illustrating a light emitting element, a wavelength conversion layer, an anti-reflection layer, a first selective reflection film, a second selective reflection film, and a second color filter of a second light emitting area of FIG. 16.

The second insulating film INS2 may be positioned on the sides of each of the light emitting elements LE. The second insulating film INS2 may not be positioned on an upper surface of each of the light emitting elements LE. In addition, the second insulating film INS2 may be positioned on the sides of each of the pixel electrodes 111 and the connection electrodes 112. For example, FIG. 17 shows the second insulating film INS2 positioned on respective sides of the connection electrode 112. The second insulating film INS2 may be formed of an inorganic film such as a silicon oxide film ($SiO_2$), an aluminum oxide film ($Al_2O_3$), and/or a hafnium oxide film ($HfO_x$), but is not limited thereto.

The common electrode CE may be on the upper surface of each of the light emitting elements LE, an upper surface of the first insulating film INS1, and an upper surface of the second insulating film INS2. The common electrode CE may completely cover each of the light emitting elements LE.

The common electrode CE may include a transparent conductive material. For example, the common electrode CE may include a transparent conductive oxide (TCO) such as indium tin oxide (ITO) and/or indium zinc oxide (IZO).

The light transmitting layer TPL may be on the common electrode CE in each of the first light emitting areas EA1. The light transmitting layer TPL may overlap the light emitting element LE in the third direction DR3 in each of the first light emitting areas EA1. The light transmitting layer TPL may completely cover the light emitting element LE in each of the first light emitting areas EA1.

The light transmitting layer TPL may include a light-transmissive organic material. For example, the light transmitting layer TPL may include an epoxy-based resin, an acrylic resin, a cardo-based resin, and/or an imide-based resin.

The wavelength conversion layer QDL may be on the common electrode CE in each of the second light emitting areas EA2 and the third light emitting areas EA3. The wavelength conversion layer QDL may overlap the light emitting element LE in the third direction DR3 in each of the second light emitting areas EA2 and the third light emitting areas EA3. The wavelength conversion layer QDL may completely cover the light emitting elements LE in each of the second light emitting areas EA2 and the third light emitting areas EA3.

The wavelength conversion layer QDL may include a first base resin BRS1 and first wavelength conversion particles WCP1. The first base resin BRS1 may include a light-transmissive organic material. For example, the first base resin BRS1 may include an epoxy-based resin, an acrylic resin, a cardo-based resin, and/or an imide-based resin.

The first wavelength conversion particles WCP1 may convert the first light emitted from the light emitting element LE into the fourth light. For example, the first wavelength conversion particles WCP1 may convert the light of the blue wavelength band into light of a yellow wavelength band. The first wavelength conversion particles WCP1 may be quantum dots (QD), quantum rods, fluorescent materials, and/or phosphorescent materials. The quantum dots may include group IV nanocrystal, group II-VI compound nanocrystal, group III-V compound nanocrystal, group IV-VI nanocrystal, or any combination thereof.

The quantum dots may include a core and a shell that over-coats (e.g., surrounds) the core. For example, the core may be, but is not limited to, at least one of CdS, CdSe, CdTe, ZnS, ZnSe, ZnTe, GaN, GaP, GaAs, GaSb, AlN, AlP, AlAs, AlSb, InP, InAs, InSb, SiC, Ca, Se, In, P, Fe, Pt, Ni, Co, Al, Ag, Au, Cu, FePt, $Fe_2O_3$, $Fe_3O_4$, Si, and/or Ge. The shell may include, but is not limited to, at least one of ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, and/or PbTe.

The wavelength conversion layer QDL may further include a scatterer for scattering the light of the light emitting element LE in a random direction. In this case, the scatterer may include metal oxide particles and/or organic particles. For example, the metal oxide may be titanium oxide ($TiO_2$), zirconium oxide ($ZrO_2$), silicon dioxide ($SiO_2$), aluminum oxide ($Al_2O_3$), indium oxide ($In_2O_3$), zinc oxide (ZnO), and/or tin oxide ($SnO_2$). In one or more embodiments, the organic particles may include an acrylic resin and/or a urethane-based resin. A diameter of the scatterer may be several nanometers to several tens of nanometers.

A first selective transmission film RTF1 may be between the common electrode CE and the light transmitting layer TPL in each of the first light emitting areas EA1. The first selective transmission film RTF1 may be between the common electrode CE and the wavelength conversion layer QDL in each of the second light emitting areas EA2 and the third light emitting areas EA3. The first selective transmission film RTF1 may cover the common electrode CE in each of the first light emitting areas EA1, the second light emitting areas EA2 and the third light emitting areas EA3.

A second selective transmission film RTF2 may be on the sides of the light transmitting layer TPL in each of the first light emitting areas EA1. The second selective transmission film RTF2 may be on an upper surface and sides of the wavelength conversion layer QDL in each of the second light emitting areas EA2 and the third light emitting areas EA3. The second selective transmission film RTF2 may cover the wavelength conversion layer QDL in each of the second light emitting areas EA2 and the third light emitting areas EA3.

As shown in FIG. 6, the first selective transmission film RTF1 may reflect first light LT1, which is not converted by the first wavelength conversion particles WCP1 of the wavelength conversion layer QDL and moves to a lower direction (e.g., lower portion), among the first light LT1 emitted from the light emitting element LE in each of the second light emitting areas EA2 and the third light emitting areas EA3. Also, as shown in FIG. 6, the first selective transmission film RTF1 may reflect fourth light LT4, which is converted by the first wavelength conversion particles WCP1 and moves to a lower portion, among the first light LT1 emitted from the light emitting element LE in each of the second light emitting areas EA2 and the third light emitting areas EA3. Moreover, the second selective transmission film RTF2 may reflect first light LT1, which is not converted by the first wavelength conversion particles WCP1 of the wavelength conversion layer QDL, among the first light LT1 emitted from the light emitting element LE in each of the second light emitting areas EA2 and the third light emitting areas EA3, and may transmit the fourth light LT4 converted by the first wavelength conversion particles WCP1.

Because the first light LT1 reflected by the first selective transmission film RTF1 and the second selective transmission film RTF2 re-enters the wavelength conversion layer QDL, the first light LT1 may be converted into the fourth light LT4 by the first wavelength conversion particles WCP1 of the wavelength conversion layer QDL. Also, the fourth light LT4 reflected by the first selective transmission film RTF1 may move to an upper portion and output through the second color filter CF2 or the third color filter CF3. Therefore, due to the first selective transmission film RTF1 and the second selective transmission film RTF2, efficiency of the first light LT1 emitted from the light emitting element LE and converted into the fourth light LT4 by the first wavelength conversion particles WCP1 of the wavelength conversion layer QDL may be enhanced, and efficiency of the fourth light LT4 converted by the first wavelength conversion particles WCP1 and output through the second color filter CF2 or the third color filter CF3 may be enhanced.

Each of the first selective transmission film RTF1 and the second selective transmission film RTF2 may be a distributed Bragg reflector, and a more detailed description of the first selective transmission film RTF1 and the second selective transmission film RTF2 will be provided herein below with reference to FIGS. 8 to 11.

In one or more embodiments, the first selective transmission film RTF1 may reflect the first light LT1, which moves to a lower portion without being output to the first color filter CF1, among the first light LT1 emitted from the light emitting element LE in each of the first light emitting areas EA1. The first light LT1 reflected by the first selective transmission film RTF1 may be output to the upper portion through the first color filter CF1. Therefore, due to the first selective transmission film RTF1, efficiency of the first light LT1 emitted from the light emitting element LE and output through the first color filter CF1 may be enhanced.

An anti-reflection layer ARL may be between the common electrode CE and the first selective transmission film RTF1 in each of the first light emitting areas EA1, the second light emitting areas EA2 and the third light emitting areas EA3. The anti-reflection layer ARL serves to prevent or reduce the reflection of the first light LT1 emitted from the light emitting element LE. Most of the first light LT1 emitted from the light emitting element LE may enter the light transmitting layer TPL or the wavelength conversion layer QDL due to the anti-reflection layer ARL. The anti-reflection layer ARL may be formed using the principle of the distributed Bragg reflector, and a more detailed description thereof will be provided herein below with reference to FIGS. 12 and 13.

The reflection film RF may be on the second selective transmission film RTF2 on the sides of the light transmitting layer TPL and the sides of the wavelength conversion layer QDL. The reflection film RF may also be on the common electrode CE on the first insulating film INS1. The reflection film RF serves to reflect the light moving to upper and lower sides and left and right sides, rather than in an upper direction, among the light emitted from the light emitting element LE. The reflection film RF may include a metal material having high reflectance, such as aluminum (Al). A thickness of the reflection film RF may be 0.1 µm, approximately.

The plurality of color filters CF1, CF2 and CF3 may include first color filters CF1, second color filters CF2, and third color filters CF3.

Each of the first color filters CF1 may be on the light transmitting layer TPL in the first light emitting area EA1. Each of the first color filters CF1 may transmit the first light and absorb, block, or reduce the second light and the third light. For example, each of the first color filters CF1 may transmit light of the blue wavelength band and absorb, block, or reduce light of the green and red wavelength bands. Therefore, each of the first color filters CF1 may transmit the first light emitted from the light emitting element LE. For example, the first light emitted from the light emitting element LE in the first light emitting area EA1 is not converted by a separate wavelength conversion layer, and may transmit the first color filter CF1 through the light transmitting layer TPL. Therefore, each of the first light emitting areas EA1 may emit the first light.

Each of the second color filters CF2 may be on the wavelength conversion layer QDL in the second light emitting area EA2. Each of the second color filters CF2 may transmit the second light and absorb, block, or reduce the first light and the third light. For example, each of the second color filters CF2 may transmit the light of the green wavelength band and absorb, block, or reduce the light of the blue and red wavelength bands. Therefore, each of the second color filters CF2 may absorb, block, or reduce the first light that is not converted by the wavelength conversion layer QDL among the first light emitted from the light emitting element LE. In one or more embodiments, each of the second color filters CF2 may transmit the second light corresponding to the green wavelength band among the fourth light converted by the wavelength conversion layer QDL, and may absorb, block, or reduce the first light corresponding to the blue wavelength band. Therefore, each of the second light emitting areas EA2 may emit the second light.

Each of the third color filters CF3 may be on the wavelength conversion layer QDL in the third light emitting area EA3. Each of the third color filters CF3 may transmit the third light and absorb, block, or reduce the first light and the second light. For example, each of the third color filters CF3 may transmit the light of the red wavelength band and absorb, block, or reduce the light of the blue and green wavelength bands. Therefore, each of the third color filters CF3 may absorb, block, or reduce the first light that is not converted by the wavelength conversion layer QDL among the first light emitted from the light emitting element LE. In addition, each of the third color filters CF3 may transmit the third light corresponding to the red wavelength band among the fourth light converted by the wavelength conversion layer QDL, and may absorb, block, or reduce the second light corresponding to the green wavelength band. Therefore, each of the third light emitting areas EA3 may emit the third light.

A black matrix may be positioned among the plurality of color filters CF1, CF2, and CF3. For example, the black matrix may be between the first color filter CF1 and the second color filter CF2, between the second color filter CF2 and the third color filter CF3, and between the first color filter CF1 and the third color filter CF3. The black matrix may include inorganic black pigments and/or organic black pigments, such as carbon black.

As shown in FIGS. 4B to 7, the light transmitting layer TPL is on the upper surface and sides of the light emitting element LE in each of the first light emitting areas EA1, and the wavelength conversion layer QDL is on the upper surface and sides of the light emitting element LE in each of the second light emitting areas EA2 and the third light emitting area EA3. In addition, the reflection film RF is on the sides of the light transmitting layer TPL in each of the first light emitting areas EA1 and the sides of the wavelength conversion layer QDL in each of the second light emitting areas EA2 and the third light emitting areas EA3. Therefore, the light moving to upper and lower sides and left and right sides, rather than in an upper direction, among the light emitted from the light emitting element LE may be reflected by the reflection film RF. Therefore, even though a separate partition is not provided between the light emitting elements LE of the light emitting areas EA1, EA2 and EA3 adjacent to one another, mixing of the light emitted from the light emitting elements LE of the adjacent light emitting areas EA1, EA2, and EA3 may be prevented or reduced.

Also, as shown in FIGS. 4B to 7, the first selective transmission film RTF1 and the second selective transmission film RTF2 reflect the first light that is not converted by the first wavelength conversion particles WCP1 of the wavelength conversion layer QDL among the first light LT1 emitted from the light emitting element LE in each of the second light emitting areas EA2 and the third light emitting areas EA3. Also, the first selective transmission film RTF1 reflects the fourth light converted by the first wavelength conversion particles WCP1 among the first light LT1 emitted from the light emitting element LE in each of the second light emitting areas EA2 and the third light emitting areas EA3. Therefore, due to the first selective transmission film RTF1 and the second selective transmission film RTF2, efficiency of the first light emitted from the light emitting element LE and converted into the fourth light by the first wavelength conversion particles WCP1 of the wavelength conversion layer QDL may be enhanced, and efficiency of the fourth light LT4 converted by the first wavelength conversion particles WCP1 and output through the second color filter CF2 and/or the third color filter CF3 may be enhanced.

Figure 8:
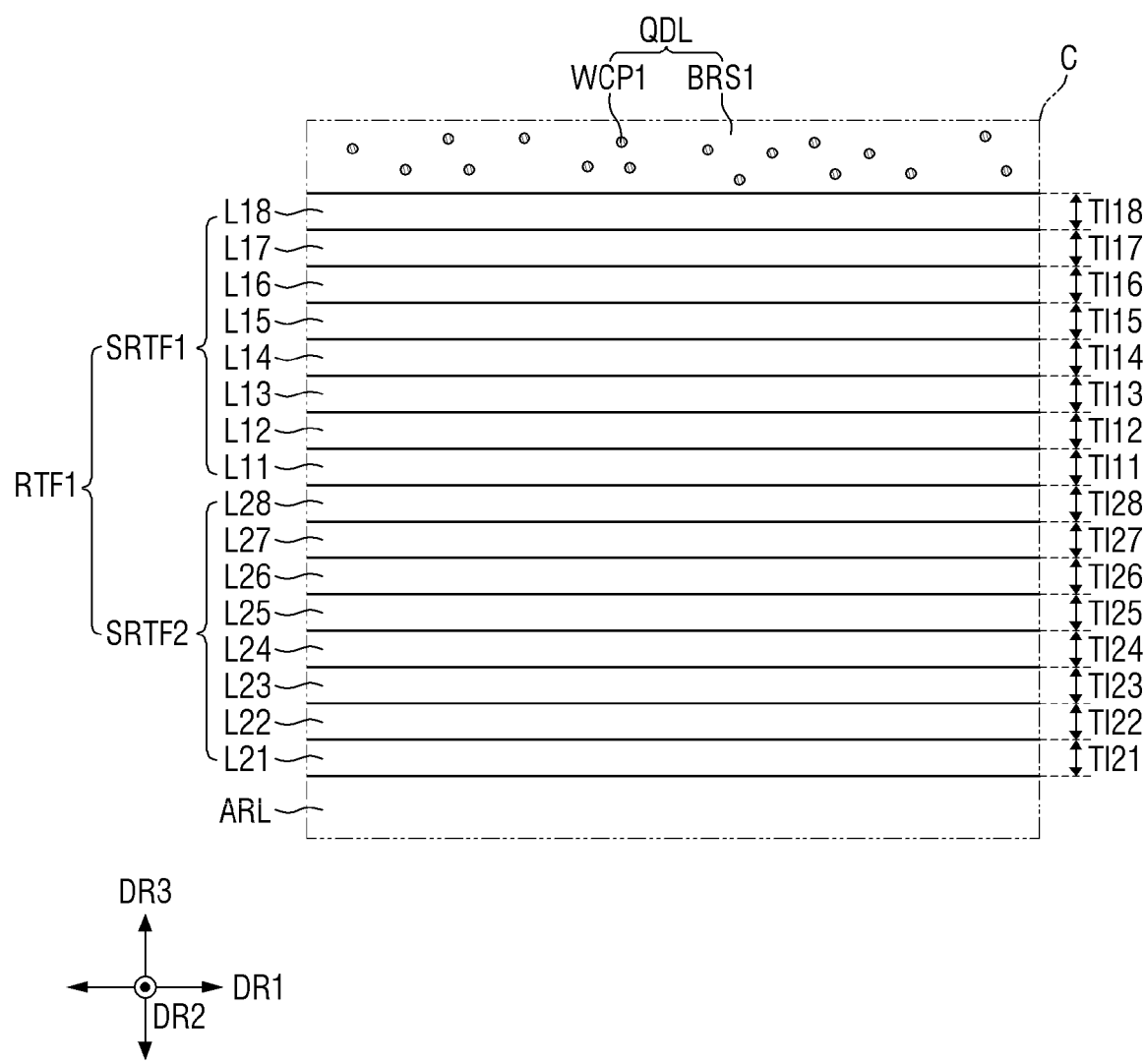
FIG. 8 is an enlarged cross-sectional view illustrating an example of the first selective transmission film of FIG. 6.
Figure 9:
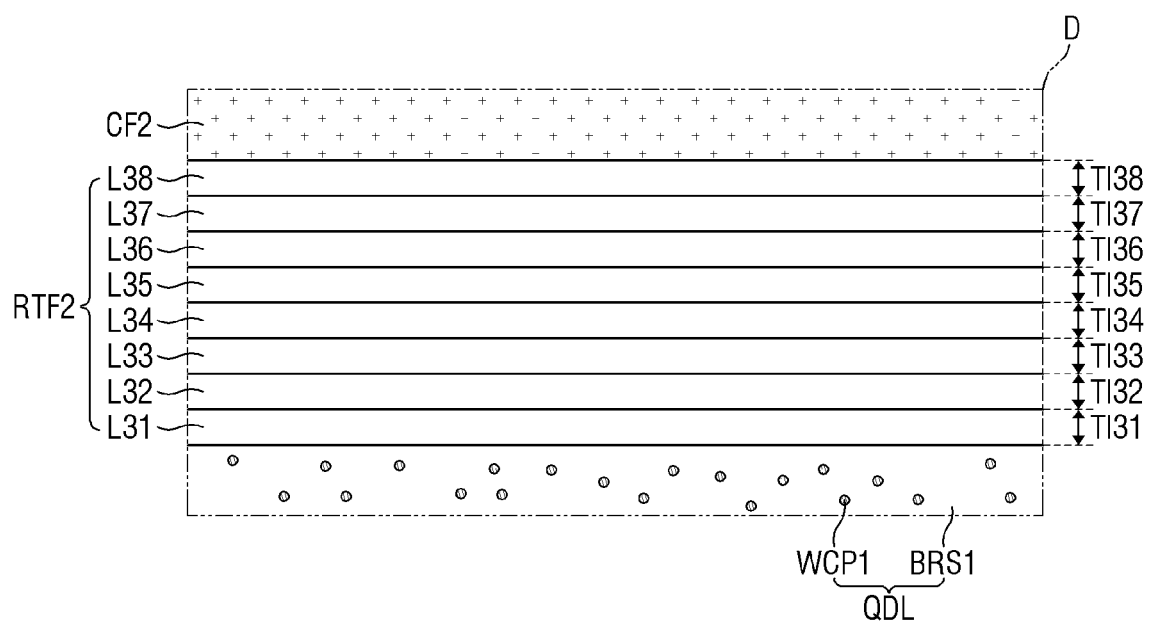
FIG. 9 is an enlarged cross-sectional view illustrating an example of the second selective transmission film of FIG. 6.
Figure 10:
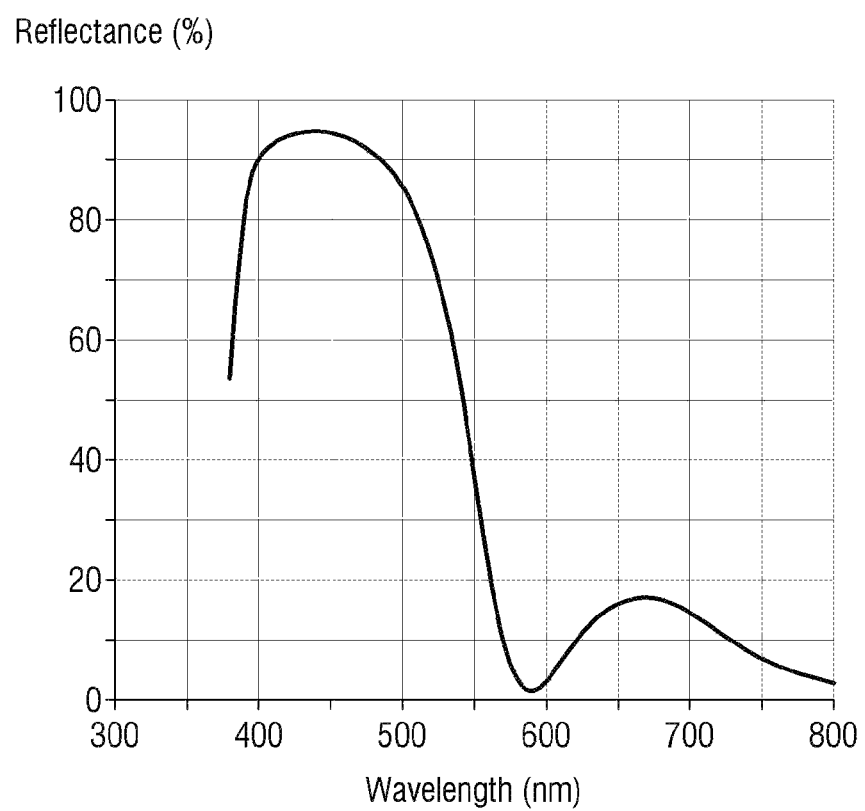
FIG. 10 is a graph illustrating reflective wavelength bands of a first sub-selective transmission film of the first selective transmission film of FIG. 8 and the second selective transmission film of FIG. 9.
Figure 11:
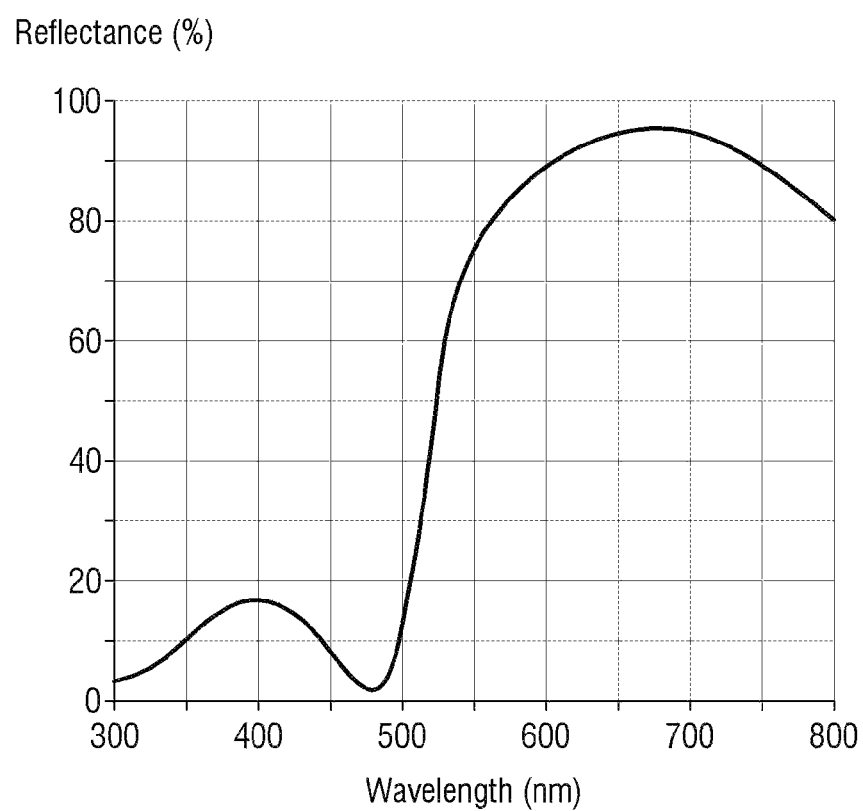
FIG. 11 is a graph illustrating an example of a reflective wavelength band of a second sub-selective transmission film of the first selective transmission film of FIG. 8.

FIG. 8 is an enlarged cross-sectional view illustrating an example of the first selective transmission film of FIG. 6. FIG. 9 is an enlarged cross-sectional view illustrating an example of the second selective transmission film of FIG. 6. FIG. 10 is a graph illustrating reflective wavelength bands of a first sub-selective transmission film of the first selective transmission film of FIG. 8 and the second selective transmission film of FIG. 9. FIG. 11 is a graph illustrating an example of a reflective wavelength band of a second sub-selective transmission film of the first selective transmission film of FIG. 8. An enlarged cross-sectional view of an area C of FIG. 6 is shown in FIG. 8, and an enlarged cross-sectional view of an area D of FIG. 6 is shown in FIG. 9.

Referring to FIGS. 8 to 11, the first selective transmission film RTF1 may include a first sub-selective transmission film SRTF1 for reflecting first light LT1 and a second sub-selective transmission film SRTF2 for reflecting second light LT2 (where the second light LT2 may refer to the fourth light). Although FIG. 8 illustrates that the first sub-selective transmission film SRTF1 is on the second sub-selective transmission film SRTF2, the embodiments of the present disclosure are not limited thereto. The second sub-selective transmission film STRF2 may be on the first sub-selective transmission film STRF1. Each of the first sub-selective transmission film SRTF1, the second sub-selective transmission film SRTF2, and the second selective transmission film RTF2 may include a plurality of layers to serve as a distributed Bragg reflector.

The first sub-selective transmission film SRTF1 may include first to eighth layers L11, L12, L13, L14, L15, L16, L17 and L18 as shown in FIG. 8, but the number of the plurality of layers of the first sub-selective transmission film SRTF1 is not limited thereto.

Among the first to eighth layers L11, L12, L13, L14, L15, L16, L17 and L18 of the first sub-selective transmission film SRTF1, each of first odd layers (first odd numbered layers), for example, the first layer L11, the third layer L13, the fifth layer L15, and the seventh layer L17 may have a first refractive index. Among the first to eighth layers L11, L12, L13, L14, L15, L16, L17 and L18 of the first sub-selective transmission film SRTF1, each of first even layers (first even numbered layers), for example, the second layer L12, the fourth layer L14, the sixth layer L16 and the eighth layer L18 may have a second refractive index. The first refractive index may be lower than the second refractive index.

In one or more embodiments, the first layer L11, the third layer L13, the fifth layer L15 and the seventh layer L17 of the first sub-selective transmission film SRTF1 may be low refractive layers, and the second layer L12, the fourth layer L14, the sixth layer L16 and the eighth layer L18 of the first sub-selective transmission film SRTF1 may be high refractive layers. For example, the first sub-selective transmission film SRTF1 may have a structure in which low refractive layers and high refractive layers are alternately placed. For example, the low refractive layer may be a silicon oxide film ($SiO_2$) having a refractive index of 1.46488, approximately, and the high refractive layer may be a titanium oxide film ($TiO_2$) having a refractive index of 2.40695, approximately.

A wavelength band in which the light entering the first sub-selective transmission film SRTF1 is reflected may be set by adjusting a thickness of each of the first to eighth layers L11, L12, L13, L14, L15, L16, L17 and L18 of the first sub-selective transmission film SRTF1. For example, when a thickness TI11 of the first layer L11, a thickness TI12 of the second layer L12, a thickness TI13 of the third layer L13, a thickness TI14 of the fourth layer L14, a thickness TI15 of the fifth layer L15, a thickness TI16 of the sixth layer L16, a thickness TI17 of the seventh layer L17, and a thickness TI18 of the eighth layer L18 are set as listed in Table 1, the first sub-selective transmission film SRTF1 may reflect 90% or more of the light of the wavelength band approximately ranging from 400 nm to 500 nm among the light incident from the wavelength conversion layer QDL as shown in FIG. 10.

TABLE 1

| | |
|---|---|
| Thickness TI11 of the first layer L11 | 49.56 nm |
| Thickness TI12 of the second layer L12 | 50.86 nm |
| Thickness TI13 of the third layer L13 | 63.33 nm |
| Thickness TI14 of the fourth layer L14 | 60.44 nm |
| Thickness TI15 of the fifth layer L15 | 63.38 nm |
| Thickness TI16 of the sixth layer L16 | 62.74 nm |
| Thickness TI17 of the seventh layer L17 | 63.38 nm |
| Thickness TI18 of the eighth layer L18 | 49.49 nm |

Therefore, most of the first light incident from the wavelength conversion layer QDL may be reflected by the first sub-selective transmission film SRTF1. In addition, most of the fourth light (e.g., second light LT2) incident from the wavelength conversion layer QDL may transmit through the first sub-selective transmission film SRTF1 as it is, without being reflected by the first sub-selective transmission film SRTF1, and may move to the second sub-selective transmission film SRTF2.

The layer, which is on the lowest portion, among the plurality of first odd layers (first odd numbered layers) of the first sub-selective transmission film SRTF1, for example, the first layer L11, may be in contact with the second sub-selective transmission film SRTF2. The layer, which is on the uppermost portion, among the plurality of first even layers (first even numbered layers) of the first sub-selective transmission film SRTF1, for example, the eighth layer L18, may be in contact with the wavelength conversion layer QDL.

The second sub-selective transmission film SRTF2 may include first to eighth layers L21, L22, L23, L24, L25, L26, L27 and L28 as shown in FIG. 8, but the number of the plurality of layers of the second sub-selective transmission film SRTF2 is not limited thereto.

Among the first to eighth layers L21, L22, L23, L24, L25, L26, L27 and L28 of the second sub-selective transmission film SRTF2, each of second odd layers (second odd numbered layers), for example, the first layer L21, the third layer L23, the fifth layer L25, and the seventh layer L27 may have a third refractive index. Among the first to eighth layers L21, L22, L23, L24, L25, L26, L27 and L28 of the second sub-selective transmission film SRTF2, each of second even layers (second even numbered layers), for example, the second layer L22, the fourth layer L24, the sixth layer L26 and the eighth layer L28 may have a fourth refractive index. The third refractive index may be lower than the fourth refractive index.

In one or more embodiments, the first layer L21, the third layer L23, the fifth layer L25 and the seventh layer L27 of the second sub-selective transmission film SRTF2 may be low refractive layers, and the second layer L22, the fourth layer L24, the sixth layer L26 and the eighth layer L28 of the second sub-selective transmission film SRTF2 may be high refractive layers. For example, the second sub-selective transmission film SRTF2 may have a structure in which low refractive layers and high refractive layers are alternately arranged. For example, the low refractive layer may be a silicon oxide film (SiO$_2$) having a refractive index of 1.46488, approximately, and the high refractive layer may be a titanium oxide film (TiO$_2$) having a refractive index of 2.40695, approximately.

A wavelength band in which the light entering the second sub-selective transmission film SRTF2 is reflected may be set by adjusting a thickness of each of the first to eighth layers L21, L22, L23, L24, L25, L26, L27 and L28. For example, the thickness of each of the first to eighth layers L21, L22, L23, L24, L25, L26, L27 and L28 of the second sub-selective transmission film SRTF2 may be set to reflect 90% or more of the light of the wavelength band approximately ranging from 550 nm to 650 nm among the light incident from the wavelength conversion layer QDL as shown in FIG. 11. Therefore, most of the fourth light incident from the wavelength conversion layer QDL may be reflected by the second sub-selective transmission film SRTF2.

The layer, which is on the lowest portion, among the plurality of second odd layers (second odd numbered layers) of the second sub-selective transmission film SRTF2, for example, the first layer L21 may be in contact with the anti-reflection layer ARL. The layer, which is on the uppermost portion, among the plurality of second even layers (second even numbered layers) of the second sub-selective transmission film SRTF2, for example, the eighth layer L28 may be in contact with the first sub-selective transmission film STRF1.

The second selective transmission film RTF2 may include first to eighth layers L31, L32, L33, L34, L35, L36, L37 and L38 as shown in FIG. 9, but the number of the plurality of layers of the second selective transmission film RTF2 is not limited thereto.

Among the first to eighth layers L31, L32, L33, L34, L35, L36, L37 and L38 of the second selective transmission film RTF2, each of third odd layers (third odd numbered layers), for example, the first layer L31, the third layer L33, the fifth layer L35, and the seventh layer L37 may have a fifth refractive index. Among the first to eighth layers L31, L32, L33, L34, L35, L36, L37 and L38, each of third even layers (third even numbered layers), for example, the second layer L32, the fourth layer L34, the sixth layer L36 and the eighth layer L38 may have a sixth refractive index. The fifth refractive index may be higher than the sixth refractive index.

In one or more embodiments, the first layer L31, the third layer L33, the fifth layer L35 and the seventh layer L37 of the second selective transmission film RTF2 may be high refractive layers, and the second layer L32, the fourth layer L34, the sixth layer L36 and the eighth layer L38 of the second selective transmission film RTF2 may be low refractive layers. For example, the second selective transmission film RTF2 may have a structure in which high refractive layers and low refractive layers are alternately arranged. For example, the low refractive layer may be a silicon oxide film (SiO$_2$) having a refractive index of 1.46488, approximately, and the high refractive layer may be a titanium oxide film (TiO$_2$) having a refractive index of 2.40695, approximately.

A wavelength band in which the light entering the second selective transmission film RTF2 is reflected may be set by adjusting a thickness of each of the first to eighth layers L31, L32, L33, L34, L35, L36, L37 and L38. For example, when a thickness TI31 of the first layer L31, a thickness TI32 of the second layer L32, a thickness TI33 of the third layer L33, a thickness TI34 of the fourth layer L34, a thickness TI35 of the fifth layer L35, a thickness TI36 of the sixth layer L36, a thickness TI37 of the seventh layer L37, and a thickness TI38 of the eighth layer L38 are set as listed in Table 2, the second selective transmission film RTF2 may reflect 90% or more of the light of the wavelength band approximately ranging from 400 nm to 500 nm among the light incident from the wavelength conversion layer QDL as shown in FIG. 10.

TABLE 2

| | |
|---|---|
| Thickness TI31 of the first layer L31 | 49.49 nm |
| Thickness TI32 of the second layer L32 | 63.38 nm |
| Thickness TI33 of the third layer L33 | 62.74 nm |
| Thickness TI34 of the fourth layer L34 | 63.38 nm |
| Thickness TI35 of the fifth layer L35 | 60.44 nm |
| Thickness TI36 of the sixth layer L36 | 63.33 nm |
| Thickness TI37 of the seventh layer L37 | 50.86 nm |
| Thickness TI38 of the eighth layer L38 | 49.56 nm |

Therefore, most of the first light incident from the wavelength conversion layer QDL may be reflected by the second selective transmission film RTF2. In addition, most of the fourth light incident from the wavelength conversion layer QDL may transmit through the second selective transmission film RTF2 as it is without being reflected by the second selective transmission film RTF2.

The layer, which is on the lowest portion, among the plurality of third odd layers (third odd numbered layers) of the second selective transmission film RTF2, for example, the first layer L31 may be in contact with the wavelength conversion layer QDL. The layer, which is on the uppermost portion, among the plurality of third even layers (third even numbered layers) of the second selective transmission film RTF2, for example, the eighth layer L38 may be in contact with the second color filter CF2 or the third color filter CF3.

In one or more embodiments, the first sub-selective transmission film SRTF1 reflects the first light moving from the wavelength conversion layer QDL to a lower direction (e.g., lower portion), whereas the second selective transmission film RTF2 reflects the first light moving from the wavelength conversion layer QDL to an upper direction (e.g., upper portion). Therefore, the plurality of layers of the first sub-selective transmission film SRTF1 and the plurality of layers of the second selective transmission film RTF2 may be symmetrical with each other based on (e.g., relative to) the wavelength conversion layer QDL.

A material and a thickness (as listed in Table 1 and Table 2) of the first layer L11 of the first sub-selective transmission film SRTF1 may substantially be the same as those of the eighth layer L38 of the second selective transmission film RTF2, a material and a thickness of the second layer L12 of the first sub-selective transmission film SRTF1 may substantially be the same as those of the seventh layer L37 of the second selective transmission film RTF2, and a material and a thickness of the third layer L13 of the first sub-selective transmission film SRTF1 may substantially be the same as those of the sixth layer L36 of the second selective transmission film RTF2. Also, a material and a thickness of the fourth layer L14 of the first sub-selective transmission film SRTF1 may substantially be the same as those of the fifth layer L35 of the second selective transmission film RTF2, a material and a thickness of the fifth layer L15 of the first sub-selective transmission film SRTF1 may substantially be the same as those of the fourth layer L34 of the second selective transmission film RTF2, and a material and a thickness of the sixth layer L16 of the first sub-selective transmission film SRTF1 may substantially be the same as those of the third layer L33 of the second selective transmission film RTF2. Moreover, a material and a thickness of the seventh layer L17 of the first sub-selective transmission film SRTF1 may substantially be the same as those of the second layer L32 of the second selective transmission film RTF2, and a material and a thickness of the eighth layer L18 of the first sub-selective transmission film SRTF1 may substantially be the same as those of the first layer L31 of the second selective transmission film RTF2.

Figure 12:
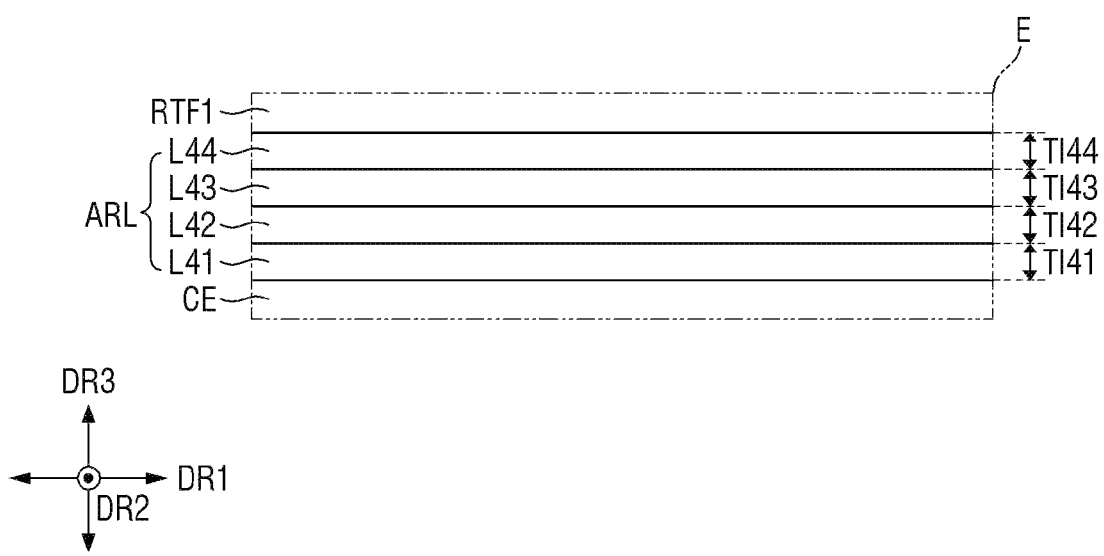
FIG. 12 is an enlarged cross-sectional view illustrating an example of the anti-reflection layer of FIG. 6.
Figure 13:
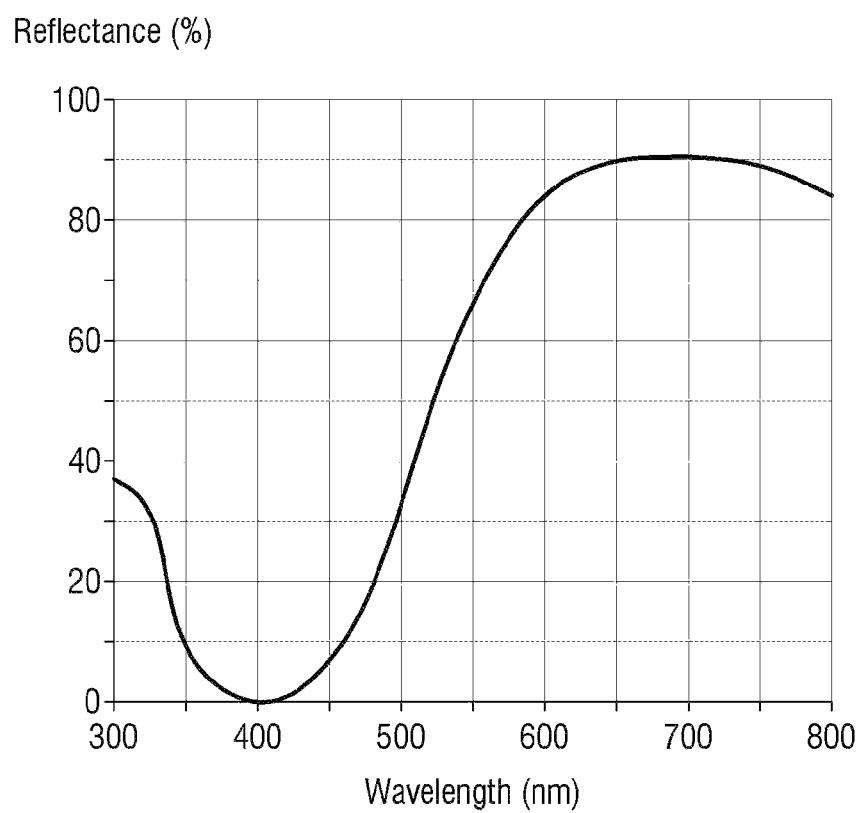
FIG. 13 is a graph illustrating an example of a reflective wavelength band of the anti-reflection layer of FIG. 12.

FIG. 12 is an enlarged cross-sectional view illustrating an example of the anti-reflection layer of FIG. 6. FIG. 13 is a graph illustrating an example of a reflective wavelength band of the anti-reflection layer of FIG. 12. An enlarged cross-sectional view of an area E of FIG. 6 is shown in FIG. 12.

Referring to FIGS. 12 and 13, the anti-reflection layer ARL may include a plurality of layers to serve as a distributed Bragg reflector. For example, the anti-reflection layer ARL may include first to fourth layers L41, L42, L43 and L44, but the number of the plurality of layers of the anti-reflection layer ARL is not limited thereto.

Among the first to fourth layers L41, L42, L43 and L44 of the anti-reflection layer ARL, each of fourth odd layers (fourth odd numbered layers), for example, the first layer L41 and the third layer L43 may have a seventh refractive index. Among the first to fourth layers L41, L42, L43 and L44 of the anti-reflection layer ARL, each of fourth even layers (fourth even numbered layers), for example, the second layer L42 and the fourth layer L44 may have an eighth refractive index. The seventh refractive index may be lower than the eighth refractive index.

In one or more embodiments, the first layer L41 and the third layer L43 of the anti-reflection layer ARL may be low refractive layers, and the second layer L42 and the fourth layer L44 of the anti-reflection layer ARL may be high refractive layers. For example, the anti-reflection layer ARL may have a structure in which low refractive layers and high refractive layers are alternately arranged. For example, the low refractive layer may be a silicon oxide film ($SiO_2$) having a refractive index of 1.46488, approximately, and the high refractive layer may be a titanium oxide film ($TiO_2$) having a refractive index of 2.40695, approximately.

A wavelength band in which the light entering the anti-reflection layer ARL is reflected may be set by adjusting a thickness of each of the first to fourth layers L41, L42, L43 and L44. For example, the thickness of each of the first to fourth layers L41, L42, L43 and L44 of the anti-reflection layer ARL may be set such that the anti-reflection layer ARL does not reflect light having a wavelength band approximately ranging from 370 nm to 460 nm as shown in FIG. 13. Therefore, most of the first light incident from the light emitting element LE may transmit through the anti-reflection layer ARL without being reflected by the anti-reflection layer ARL.

The layer, which is on the lowest portion, among the plurality of fourth odd layers (fourth odd numbered layers) of the anti-reflection layer ARL, for example, the first layer L41 may be in contact with the common electrode CE. The layer, which is on the uppermost portion, among the plurality of fourth even layers (fourth even numbered layers) of the anti-reflection layer ARL, for example, the fourth layer L44 may be in contact with the first selective transmission film RTF1.

Figure 14:
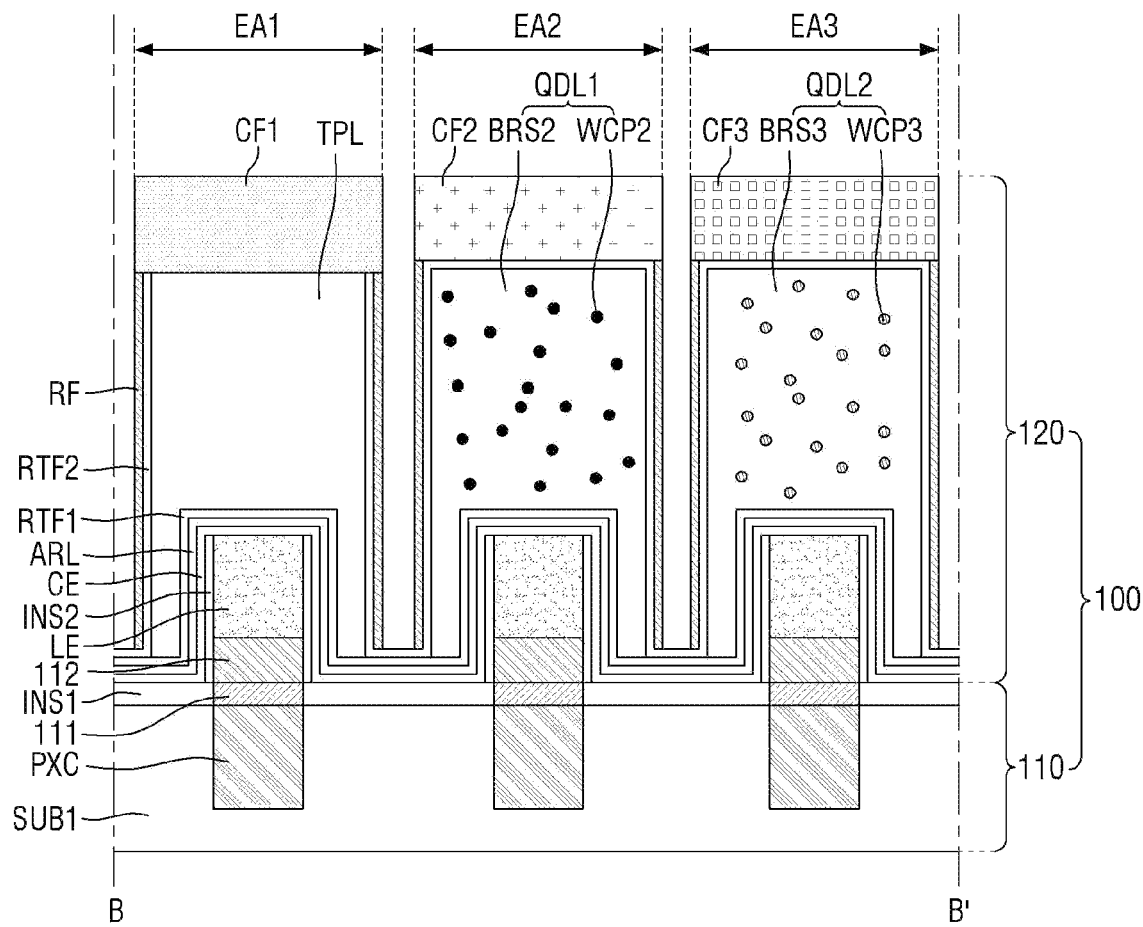
FIG. 14 is a cross-sectional view illustrating another example of a display panel taken along line B-B' of FIG. 3.

FIG. 14 is a cross-sectional view illustrating another example of a display panel taken along line B-B' of FIG. 3. The embodiment of FIG. 14 is different from the embodiment of FIG. 5 in that a first wavelength conversion layer QDL1 is provided in each of the second light emitting areas EA2, and a second wavelength conversion layer QDL2 is provided in each of the third light emitting areas EA3. In FIG. 14, the description that are duplicative with those provided in connection with the embodiment of FIG. 5 will not be provided again.

Referring to FIG. 14, the first wavelength conversion layer QDL1 may be on the common electrode CE in each of the second light emitting areas EA2. The first wavelength conversion layer QDL1 may overlap the light emitting element LE in the third direction DR3 in each of the second light emitting areas EA2. The first wavelength conversion layer QDL1 may completely cover the light emitting element LE in each of the second light emitting areas EA2.

The first wavelength conversion layer QDL1 may include a second base resin BRS2 and second wavelength conversion particles WCP2. The second base resin BRS2 may substantially be the same as the first base resin BRS1. The second base resin BRS2 may include an epoxy-based resin, an acrylic resin, a cardo-based resin, and/or an imide-based resin. The second wavelength conversion particles WCP2 may convert the first light emitted from the light emitting element LE into the second light. For example, the second wavelength conversion particles WCP2 may convert the light of the blue wavelength band into the light of the green wavelength band.

The second wavelength conversion layer QDL2 may be on the common electrode CE in each of the third light emitting areas EA3. The second wavelength conversion layer QDL2 may overlap the light emitting element LE in the third direction DR3 in each of the third light emitting areas EA3. The second wavelength conversion layer QDL2 may completely cover the light emitting element LE in each of the third light emitting areas EA3.

The second wavelength conversion layer QDL2 may include a third base resin BRS3 and third wavelength conversion particles WCP3. The third base resin BRS3 may substantially be the same as the first base resin BRS1. The third base resin BRS3 may include an epoxy-based resin, an acrylic resin, a cardo-based resin, and/or an imide-based resin. The third wavelength conversion particles WCP3 may convert the first light emitted from the light emitting element LE into the third light. For example, the third wavelength conversion particles WCP3 may convert the light of the blue wavelength band into the light of the red wavelength band.

The second light converted by the second wavelength conversion particles WCP2 of the first wavelength conversion layer QDL1 among the first light emitted from the light emitting element LE in the second light emitting area EA2 may transmit through the second color filter CF2. The first light that is not converted by the first wavelength conversion layer QDL1 among the first light emitted from the light emitting element LE in the second light emitting area EA2 may be absorbed, blocked, or reduced by the second color filter CF2. Therefore, the second light emitting area EA2 may emit the second light.

The third light converted by the second wavelength conversion layer QDL2 among the first light emitted from the light emitting element LE in the third light emitting area EA3 may transmit through the third color filter CF3. The first light that is not converted by the second wavelength conversion layer QDL2 among the first light emitted from the light emitting element LE in the third light emitting area EA3 may be absorbed, blocked, or reduced by the third color filter CF3. Therefore, the third light emitting area EA3 may emit the third light.

Figure 15:
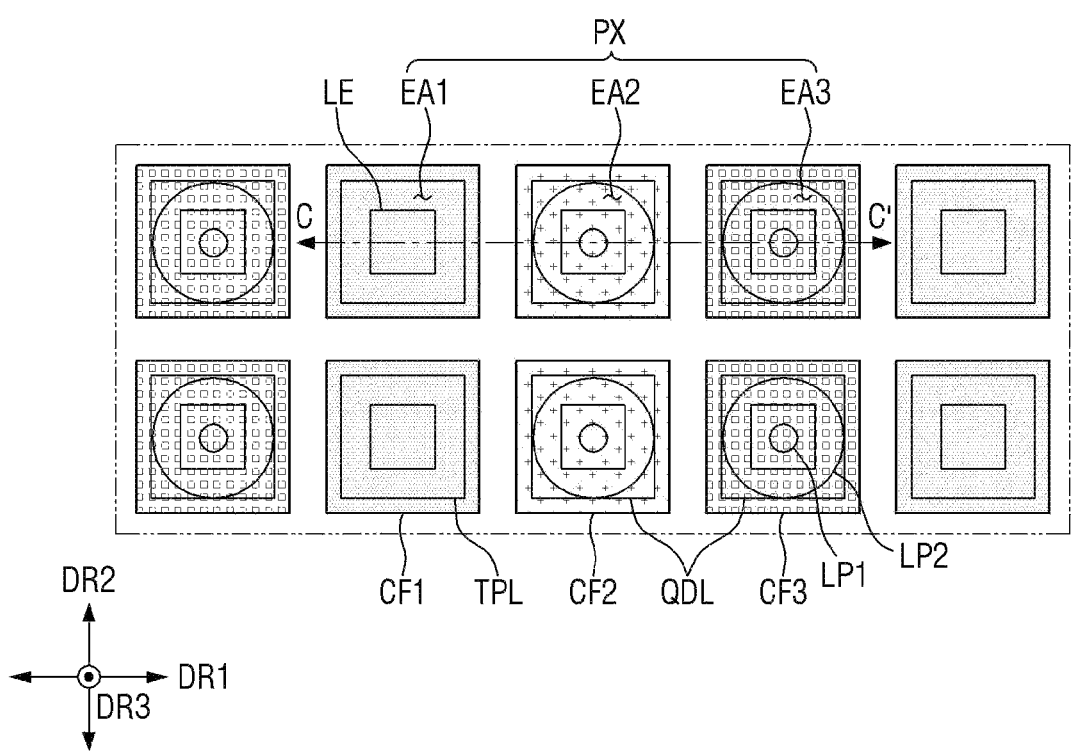
FIG. 15 is a plan view illustrating pixels of a display panel according to one or more other embodiments of the present disclosure.

FIG. 15 is a plan view illustrating pixels of a display panel according to one or more other embodiments of the present disclosure.

The embodiment of FIG. 15 is different from the embodiment of FIG. 3 in that a first optical pattern LP1 and a second optical pattern LP2 are provided in each of the second light emitting areas EA2 and the third light emitting areas EA3. In FIG. 15, the description will be based on the difference from the embodiment of FIG. 3.

Referring to FIG. 15, the first optical pattern LP1 may overlap the light emitting element LE, the wavelength conversion layer QDL and the second optical pattern LP2 in the third direction DR3 in each of the second light emitting areas EA2 and the third light emitting areas EA3. The first optical pattern LP1 may overlap the second color filter CF2 in the third direction DR3 in each of the second light emitting areas EA2. The first optical pattern LP1 may overlap the third color filter CF3 in the third direction DR3 in each of the third light emitting areas EA3.

The first optical pattern LP1 may have a circular or oval plane shape. An area of the first optical pattern LP1 may be smaller than that of the second optical pattern LP2. The area of the first optical pattern LP1 may be smaller than that of the light emitting element LE. For example, the area of the first optical pattern LP1 may be 40% to 60% of the area of the light emitting element LE, but the embodiment of the present disclosure is not limited thereto.

The second optical pattern LP2 may be to overlap the light emitting element LE, the first optical pattern LP1 and the wavelength conversion layer QDL in the third direction DR3 in each of the second light emitting areas EA2 and the third light emitting areas EA3. The second optical pattern LP2 may be to overlap the second color filter CF2 in the third direction DR3 in each of the second light emitting areas EA2. The second optical pattern LP2 may be to overlap the third color filter CF3 in the third direction DR3 in each of the third light emitting areas EA3.

The second optical pattern LP2 may have a circular or oval plane shape. An area of the second optical pattern LP2 may be greater than an area of the light emitting element LE. The area of the second optical pattern LP2 may be smaller than an area of the wavelength conversion layer QDL, but the embodiments of the present disclosure are not limited thereto. For example, when the wavelength conversion layer QDL has a circular or oval plane shape, the area of the second optical pattern LP2 may substantially be the same as that of the wavelength conversion layer QDL.

In a plane view (e.g., in a plan view), a center of the light emitting element LE, a center of the first optical pattern LP1 and a center of the second optical pattern LP2 may overlap one another in the third direction DR3.

Hereinafter, the first optical pattern LP1 and the second optical pattern LP2 will be described in more detail with reference to FIGS. 16 to 19.

Figure 16:
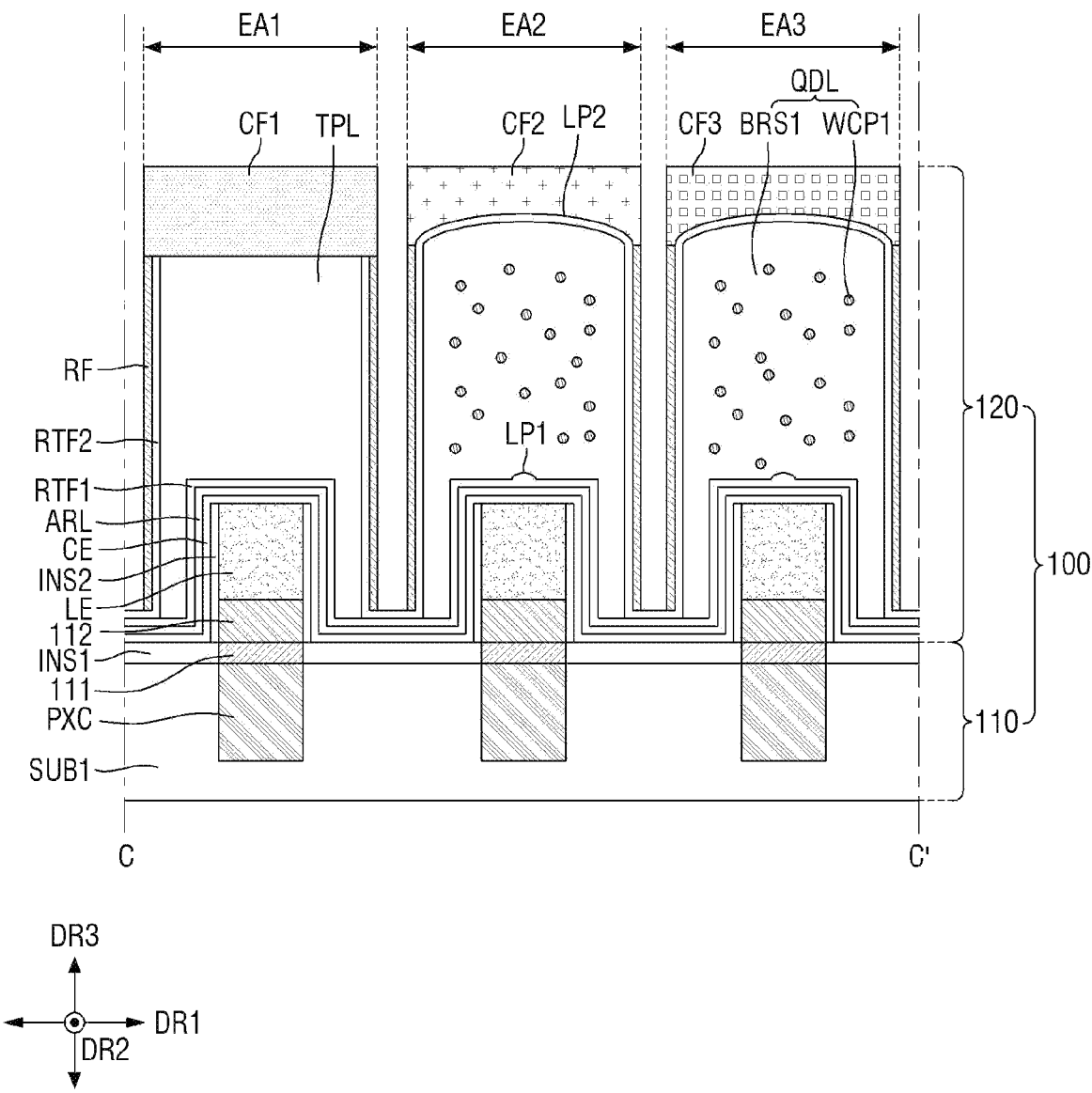
FIG. 16 is a cross-sectional view illustrating an example of a display panel taken along line C-C' of FIG. 15.

FIG. 16 is a cross-sectional view illustrating an example of a display panel taken along line C-C' of FIG. 15. FIG. 17 is an enlarged cross-sectional view illustrating a light emitting element, a wavelength conversion layer, an anti-reflection layer, a first selective reflection film, a second selective reflection film, and a second color filter of a second light emitting area of FIG. 16.

The embodiment of FIGS. 16 and 17 is different from the embodiment of FIGS. 5 and 6 in that the first selective transmission film RTF1 includes the first optical pattern LP1 and the second selective transmission film RTF2 includes the second optical pattern LP2. In FIGS. 16 and 17, the descriptions that are duplicative with the descriptions provided in connection with the embodiments of FIGS. 5 and 6 will not be provided again.

Referring to FIGS. 16 and 17, the first selective transmission film RTF1 may include the first optical pattern LP1. The first optical pattern LP1 may have a circular or oval plane shape and a cross-sectional shape convex toward an upper direction. For example, the first optical pattern LP1 may have a sphere shape or an ellipsoid shape, which is convex toward an upper direction.

The second selective transmission film RTF2 may include the second optical pattern LP2. The second optical pattern LP2 may have a circular or oval plane shape and a cross-sectional shape convex toward an upper direction. For example, the second optical pattern LP2 may have a sphere shape or an ellipsoid shape, which is convex toward an upper direction. The upper surface of the wavelength conversion layer QDL may have a cross-sectional shape convex toward an upper direction such that the second optical pattern LP2 also has a cross-sectional shape convex toward an upper direction.

Because the second selective transmission film RTF2 reflects the first light LT1 that is not converted by the first wavelength conversion particles WCP1 of the wavelength conversion layer QDL and transmits the fourth light LT4 converted by the first wavelength conversion layer WCP1, the second optical pattern LP2 may serve as a reflection member, such as a concave mirror, for the first light LT1, and may serve as a concave lens for the fourth light LT4. Also, because the first selective transmission film RTF1 reflects the fourth light LT4 converted by the first wavelength conversion layer WCP1 as well as the first light LT1 that is not converted by the first wavelength conversion particles WCP1 of the wavelength conversion layer QDL, the first optical pattern LP1 may serve as a reflection member convex with respect to the first light LT1 and the fourth light LT4. Therefore, because a path of the light is lengthened in the wavelength conversion layer QDL due to the second optical pattern LP2 and the first optical pattern LP1, efficiency of the first light LT1 converted into the fourth light LT4 by the first wavelength conversion particles WCP1 of the wavelength conversion layer QDL may be enhanced, and efficiency of the fourth light LT4 converted by the first wavelength conversion particles WCP1 and output through the second color filter CF2 or the third color filter CF3 may be enhanced.

A curvature radius of the first optical pattern LP1 may be smaller than that of the second optical pattern LP2. In this case, a curvature of the first optical pattern LP1 may be greater than that of the second optical pattern LP2. A focal distance F2 formed by the second optical pattern LP2 may be longer than a minimum distance between the first optical pattern LP1 and the second optical pattern LP2 in the third direction DR3.

For example, when a length in the first direction DR1 of the wavelength conversion layer QDL is 1 µm, a length in the third direction DR3 of the wavelength conversion layer QDL between the first selective transmission film RTF1 and the second selective transmission film RTF2 is 10.33 µm, a curvature radius of the second optical pattern LP2 is 2.5 µm, and a curvature radius of the first optical pattern LP1 may be 0.17 µm to 0.18 µm. When the curvature radius of the first optical pattern LP1 is close to 0.18 µm, a diffusion degree of the first light LT1 moving to an upper direction by being reflected by the first optical pattern LP1 may be great. The curvature radius of the first optical pattern LP1 may be changed depending on the curvature radius of the second optical pattern LP2.

Figure 18:
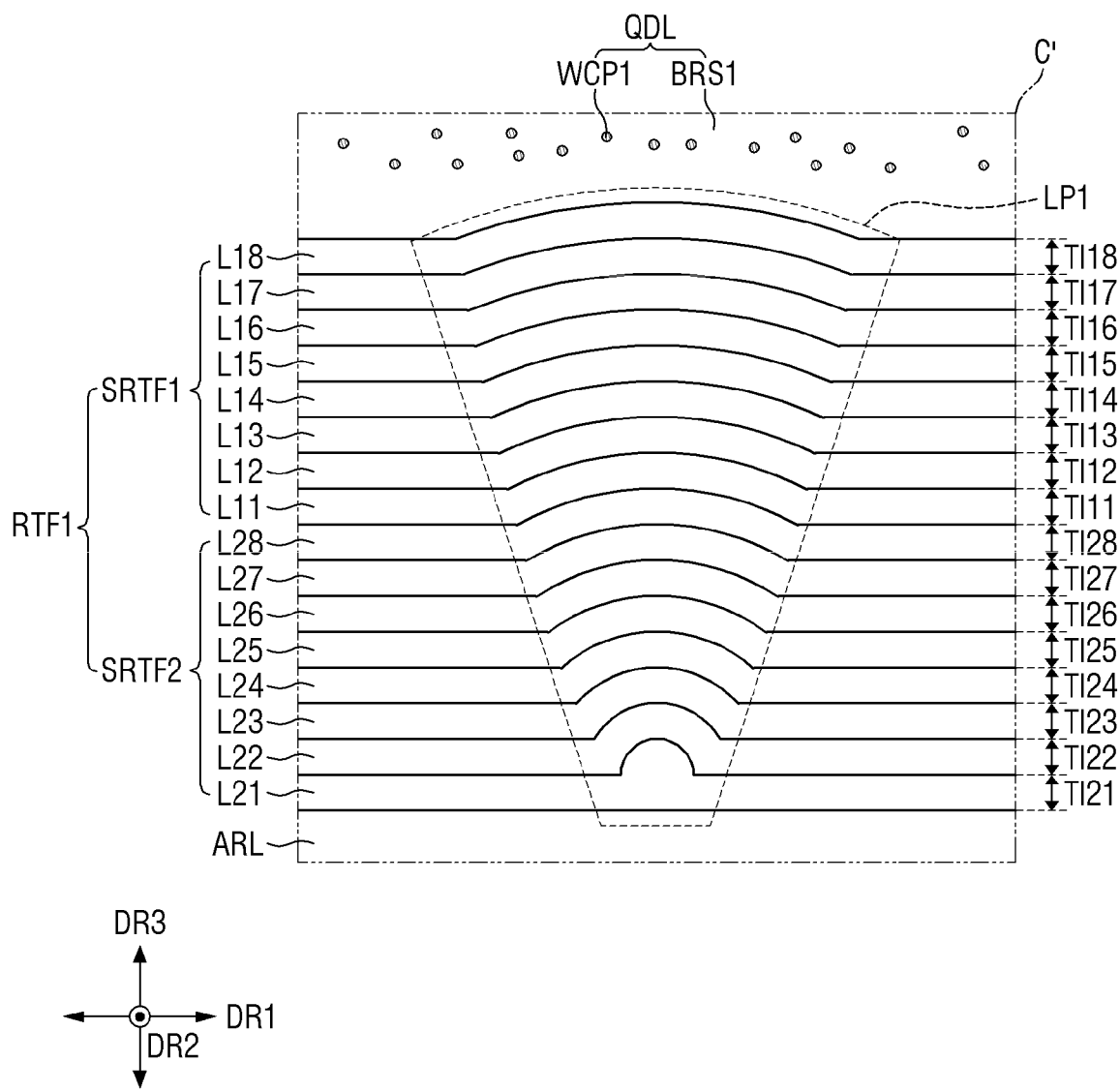
FIG. 18 is an enlarged cross-sectional view illustrating an example of the first selective transmission film of FIG. 17.
Figure 19:
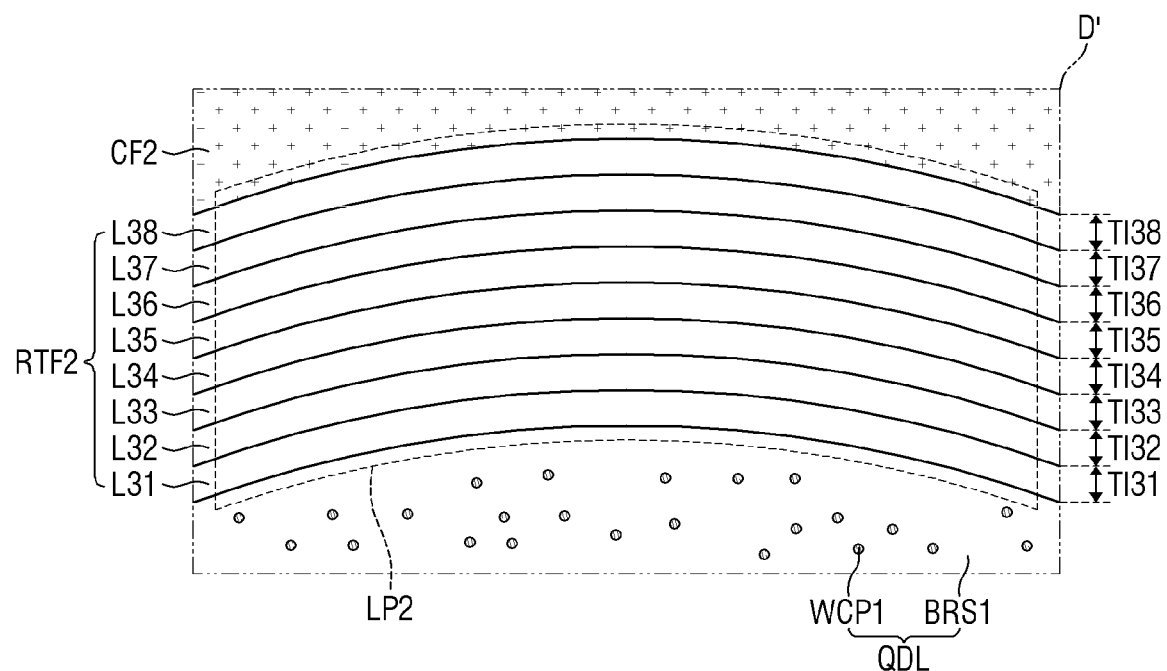
FIG. 19 is an enlarged cross-sectional view illustrating an example of the second selective transmission film of FIG. 17.

FIG. 18 is an enlarged cross-sectional view illustrating an example of the first selective transmission film RTF1 of FIG. 17. FIG. 19 is an enlarged cross-sectional view illustrating an example of the second selective transmission film RTF2 of FIG. 17. An enlarged cross-sectional view of an area C' of FIG. 17 is shown in FIG. 18, and an enlarged cross-sectional view of an area D' of FIG. 17 is shown in FIG. 19.

The embodiments of FIGS. 18 and 19 are different from the embodiments of FIGS. 8 and 9 in that the plurality of layers L11 to L18 of the first sub-selective transmission film SRTF1 of the first selective transmission film RTF1 and the plurality of layers L21 to L28 of the second sub-selective transmission film SRTF2 of the first selective transmission film RTF1 are formed to be convex toward an upper direction, and the plurality of layers L31 to L38 of the second selective transmission film RTF2 are formed to be convex toward an upper direction. In FIGS. 18 and 19, the description will be based on the difference from the embodiments of FIGS. 8 and 9.

Referring to FIGS. 18 and 19, each of the first to eighth layers L21, L22, L23, L24, L25, L26, L27 and L28 of the second sub-selective transmission film SRTF2 may include a first optical pattern LP1 formed to be convex toward an upper direction. A portion of an upper surface of the first layer L21 of the second sub-selective transmission film SRTF2 may have a section convex toward an upper direction, and each of the second to eighth layers L22, L23, L24, L25, L26, L27 and L28 of the second sub-selective transmission film SRTF2 may be aligned along a shape of the upper surface of the first layer L21. Therefore, a portion of an upper surface of each of the second to eighth layers L22, L23, L24, L25, L26, L27 and L28 of the second sub-selective transmission film SRTF2 may have a section convex toward an upper direction.

Each of the first to eighth layers L11, L12, L13, L14, L15, L16, L17 and L18 of the first sub-selective transmission film SRTF1 may include a first optical pattern LP1 formed to be convex toward an upper direction. Each of the first to eighth layers L11, L12, L13, L14, L15, L16, L17 and L18 of the first sub-selective transmission film SRTF1 may be aligned along a shape of the upper surface of the eighth layer L28 of the second sub-selective transmission film SRTF2. Therefore, a portion of an upper surface of each of the first to eighth layers L11, L12, L13, L14, L15, L16, L17 and L18 of the first sub-selective transmission film SRTF1 may have a section convex toward an upper direction.

Each of the first to eighth layers L31, L32, L33, L34, L35, L36, L37 and L38 of the second selective transmission film RTF2 may include a second optical pattern LP2 formed to be convex toward an upper direction. Each of the first to eighth layers L31, L32, L33, L34, L35, L36, L37 and L38 of the second selective transmission film RTF2 may be aligned along a shape of the upper surface of the wavelength conversion layer QDL, and the upper surface of the wavelength conversion layer QDL may have a section convex toward an upper direction. Therefore, a lower surface of each of the first to eighth layers L31, L32, L33, L34, L35, L36, L37 and L38 of the second selective transmission film RTF2 may have a section convex toward an upper direction.

FIG. 20 is a cross-sectional view illustrating another example of a display panel taken along line C-C' of FIG. 15.

The embodiment of FIG. 20 is different from the embodiment of FIG. 16 in that a first wavelength conversion layer QDL1 is provided in each of the second light emitting areas EA2 and a second wavelength conversion layer QDL2 is provided in each of the third light emitting areas EA3. Because the first wavelength conversion layer QDL1 and the second wavelength conversion layer QDL2 in the embodiment of FIG. 20 are substantially the same as those described with reference to FIG. 14, the description of these elements of FIG. 20 will not be provided again.

Figure 21:
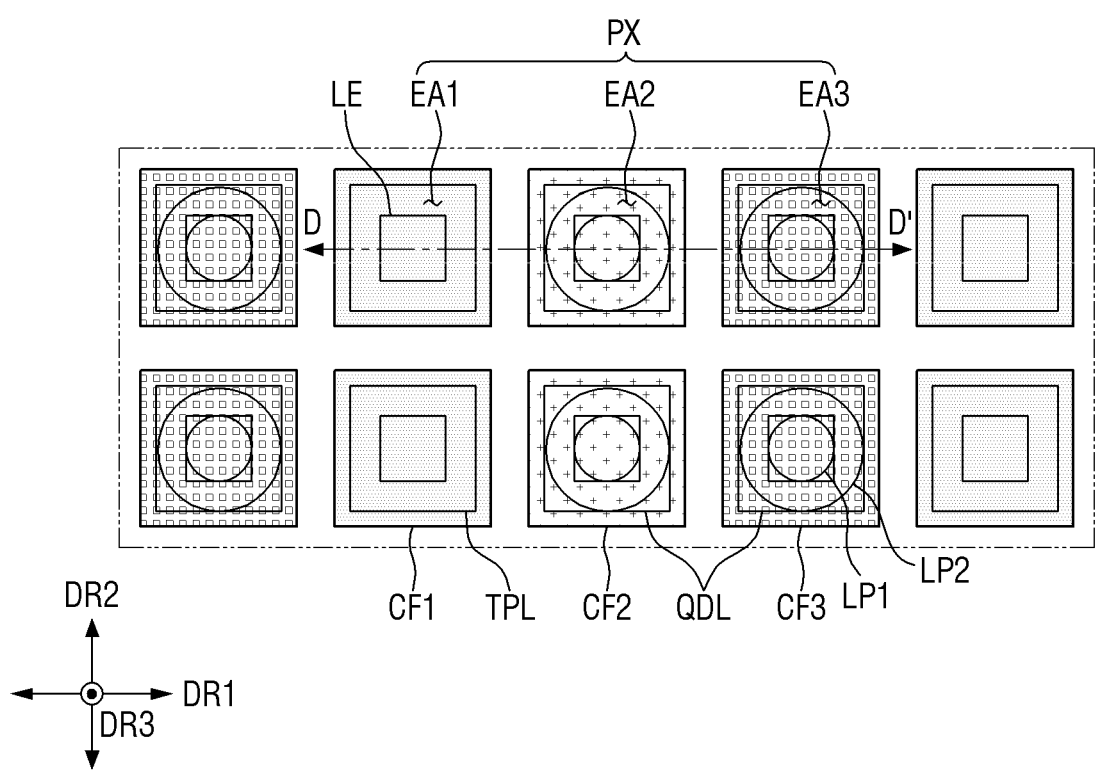
FIG. 21 is a plan view illustrating pixels of a display panel according to one or more other embodiments of the present disclosure.

FIG. 21 is a plan view illustrating pixels of a display panel according to one or more other embodiments of the present disclosure.

The embodiment of FIG. 21 is different from the embodiment of FIG. 3 in that a first optical pattern LP1 and a second optical pattern LP2 are provided in each of the second light emitting areas EA2 and the third light emitting areas EA3. In FIG. 21, the description will be based mainly on the difference from the embodiment of FIG. 3.

Referring to FIG. 21, the first optical pattern LP1 may overlap the light emitting element LE, the wavelength conversion layer QDL and the second optical pattern LP2 in the third direction DR3 in each of the second light emitting areas EA2 and the third light emitting areas EA3. The first optical pattern LP1 may overlap the second color filter CF2 in the third direction DR3 in each of the second light emitting areas EA2. The first optical pattern LP1 may overlap the third color filter CF3 in the third direction DR3 in each of the third light emitting areas EA3.

The first optical pattern LP1 may have a circular or oval plane shape. An area of the first optical pattern LP1 may be smaller than that of the second optical pattern LP2. The area of the first optical pattern LP1 may be smaller than that of the light emitting element LE, but the embodiments of the present disclosure are not limited thereto. For example, when the light emitting element LE has a circular or oval plane shape, the area of the first optical pattern LP1 may substantially be the same as that of the light emitting element LE.

The second optical pattern LP2 may overlap the light emitting element LE, the first optical pattern LP1 and the wavelength conversion layer QDL in the third direction DR3 in each of the second light emitting areas EA2 and the third light emitting areas EA3. The second optical pattern LP2 may overlap the second color filter CF2 in the third direction DR3 in each of the second light emitting areas EA2. The second optical pattern LP2 may overlap the third color filter CF3 in the third direction DR3 in each of the third light emitting areas EA3.

The second optical pattern LP2 may have a circular or oval plane shape. An area of the second optical pattern LP2 may be greater than that of the light emitting element LE. The area of the second optical pattern LP2 may be smaller than that of the wavelength conversion layer QDL, but the embodiments of the present disclosure are not limited thereto. For example, when the wavelength conversion layer QDL has a circular or oval plane shape, the area of the second optical pattern LP2 may substantially be the same as that of the wavelength conversion layer QDL.

In a plane view, a center of the light emitting element LE, a center of the first optical pattern LP1 and a center of the second optical pattern LP2 may overlap one another in the third direction DR3.

Figure 22:
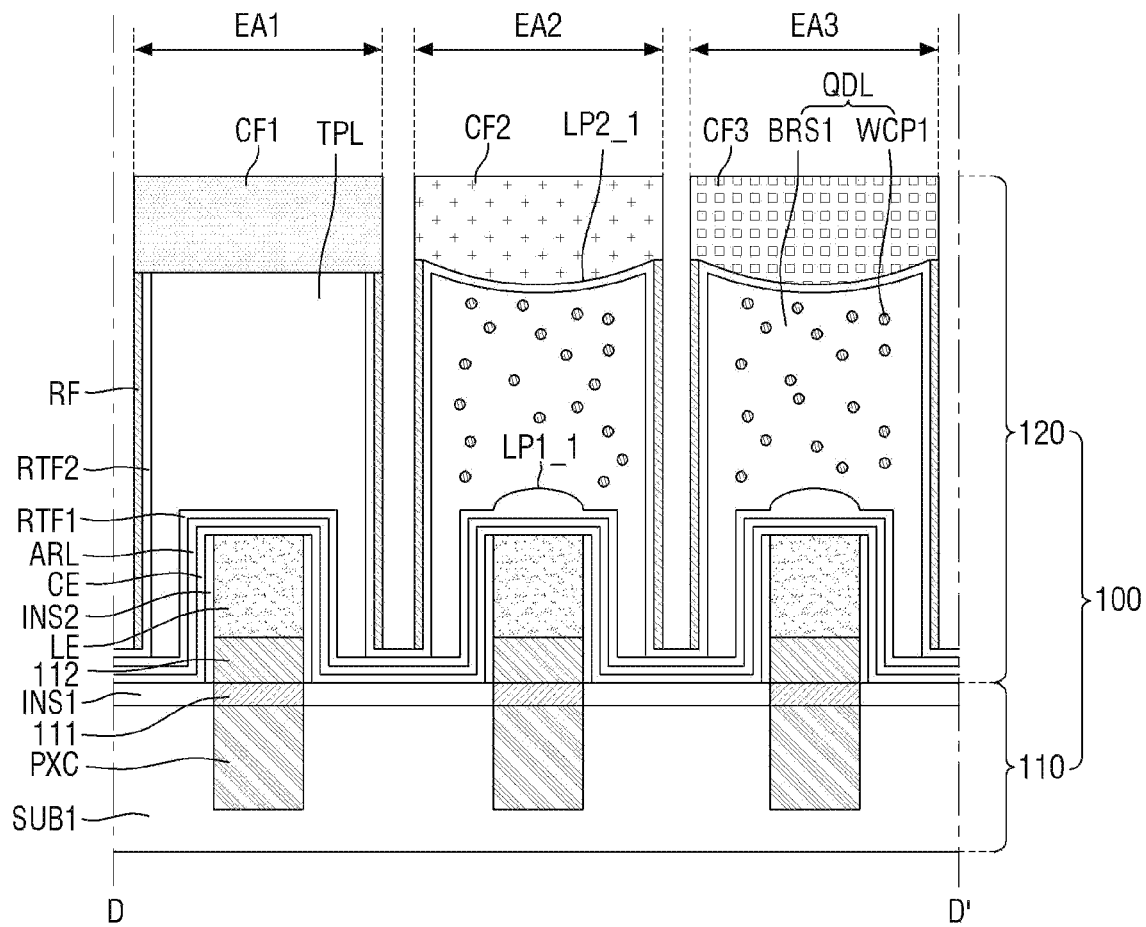
FIG. 22 is a cross-sectional view illustrating an example of a display panel taken along line D-D' of FIG. 21.
Figure 23:
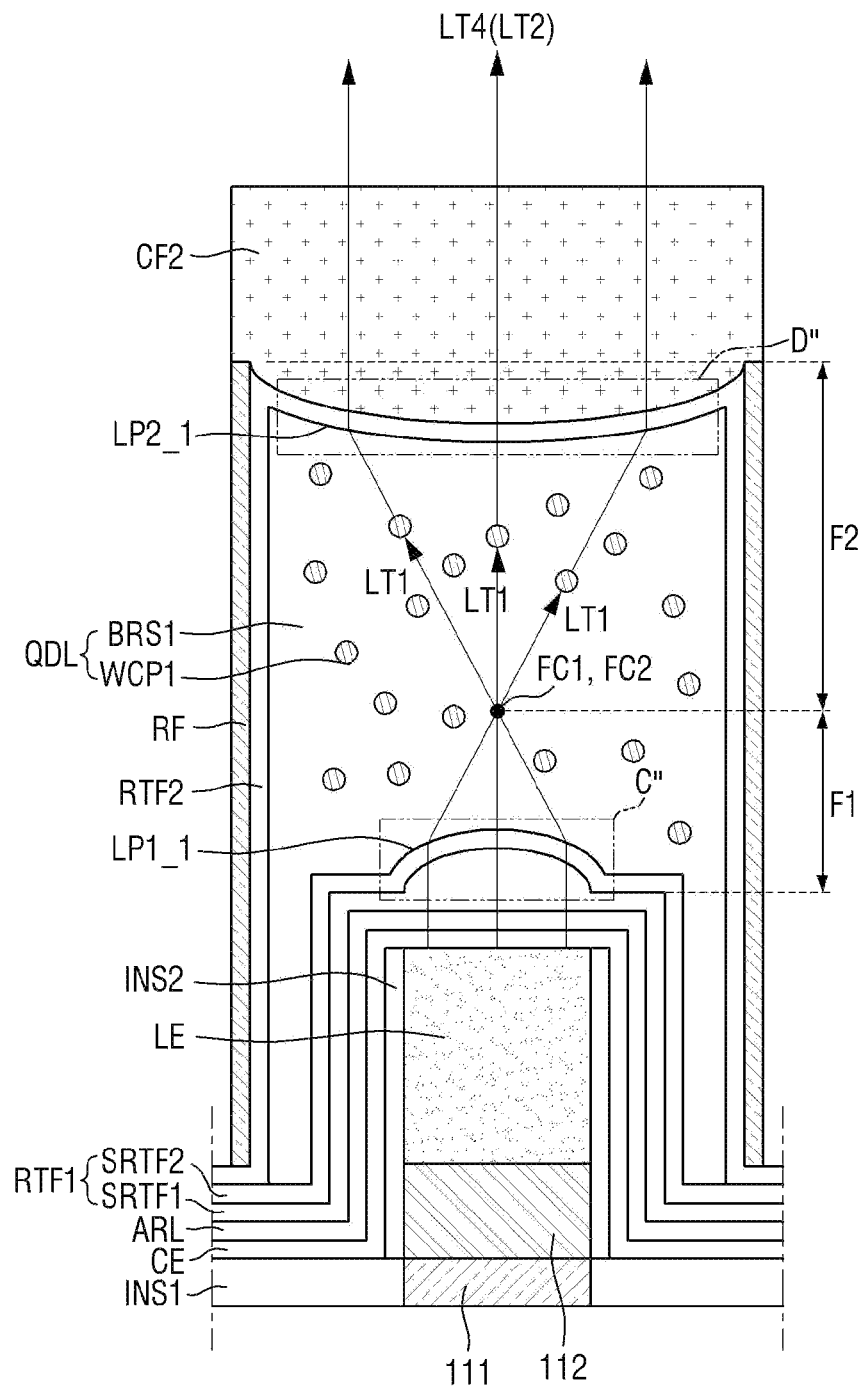
FIG. 23 is an enlarged cross-sectional view illustrating a light emitting element, a wavelength conversion layer, an anti-reflection layer, a first selective reflection film, a second selective reflection film, and a second color filter of a second light emitting area of FIG. 22.

FIG. 22 is a cross-sectional view illustrating an example of a display panel taken along line D-D' of FIG. 21. FIG. 23 is an enlarged cross-sectional view illustrating a light emitting element, a wavelength conversion layer, an anti-reflection layer, a first selective reflection film, a second selective reflection film, and a second color filter of a second light emitting area of FIG. 22.

The embodiments of FIGS. 22 and 23 are different from the embodiments of FIGS. 5 and 6 in that the first selective transmission film RTF1 includes a first optical pattern LP1_1 and the second selective transmission film RTF2 includes a second optical pattern LP2_1. In FIGS. 22 and 23, the descriptions duplicative with those provided in connection with FIGS. 5 and 6 will not be provided again.

Referring to FIGS. 22 and 23, the first selective transmission film RTF1 may include the first optical pattern LP1_1. The first optical pattern LP1_1 may have a circular or oval plane shape and a cross-sectional shape convex toward an upper direction. For example, the first optical pattern LP1_1 may have a sphere shape or an ellipsoid shape, which is convex toward an upper direction.

The second selective transmission film RTF2 may include the second optical pattern LP2_1. The second optical pattern LP2_1 may have a circular or oval plane shape and a cross-sectional shape convex toward a lower direction. For example, the second optical pattern LP2_1 may have a sphere shape or an ellipsoid shape, which is convex toward a lower direction (e.g., which is concave inward). The upper surface of the wavelength conversion layer QDL may have a cross-sectional shape convex toward a lower direction (e.g., concave) such that the second optical pattern LP2_1 has a cross-sectional shape convex toward a lower direction (e.g., concave).

A curvature radius of the first optical pattern LP1_1 may be smaller than that of the second optical pattern LP2_1. For example, a curvature of the first optical pattern LP1_1 may be greater than that of the second optical pattern LP2_1. A focal distance F2 of the second optical pattern LP2_1 may be longer than a focal distance F1 of the first optical pattern LP1_1. A focal point FC1 of the first optical pattern LP1_1 and a focal point FC2 of the second optical pattern LP2_1 may substantially be the same as each other. Therefore, a thickness Tqdl of the wavelength conversion layer QDL may substantially be the same as a sum of the focal distance F1 of the first optical pattern LP1_1 and the focal distance F2 of the second optical pattern LP2_1.

Because the first optical pattern LP1_1 covers most of the upper surface of the light emitting element LE, the first optical pattern LP1_1 may serve as a convex lens for the first light LT1 emitted from the light emitting element LE. Therefore, the first light LT1 emitted from the light emitting element LE may be condensed on the first focal point FC1 positioned at the first focal distance F1 by the first selective transmission film RTF1. Because the second selective transmission film RFT2 reflects the first light LT1 that is not converted by the first wavelength conversion particles WCP1 of the wavelength conversion layer QDL and transmits the fourth light LT4 converted by the first wavelength conversion layer WCP1, the second optical pattern LP2_1 may serve as a convex mirror for the first light LT1, and may serve as a convex lens for the fourth light LT4. Therefore, the fourth light LT4 converted by the first wavelength conversion particles WCP1 of the wavelength conversion layer QDL may be output as parallel light in the third direction DR3 by the second optical pattern LP2_1 positioned at the second focal distance F2 from the first focal point FC1. Therefore, a ratio of the light output to a front surface as compared with a side of the display device 10 may be enhanced by the first optical pattern LP1_1 and the second optical pattern LP2_1.

Figure 24:
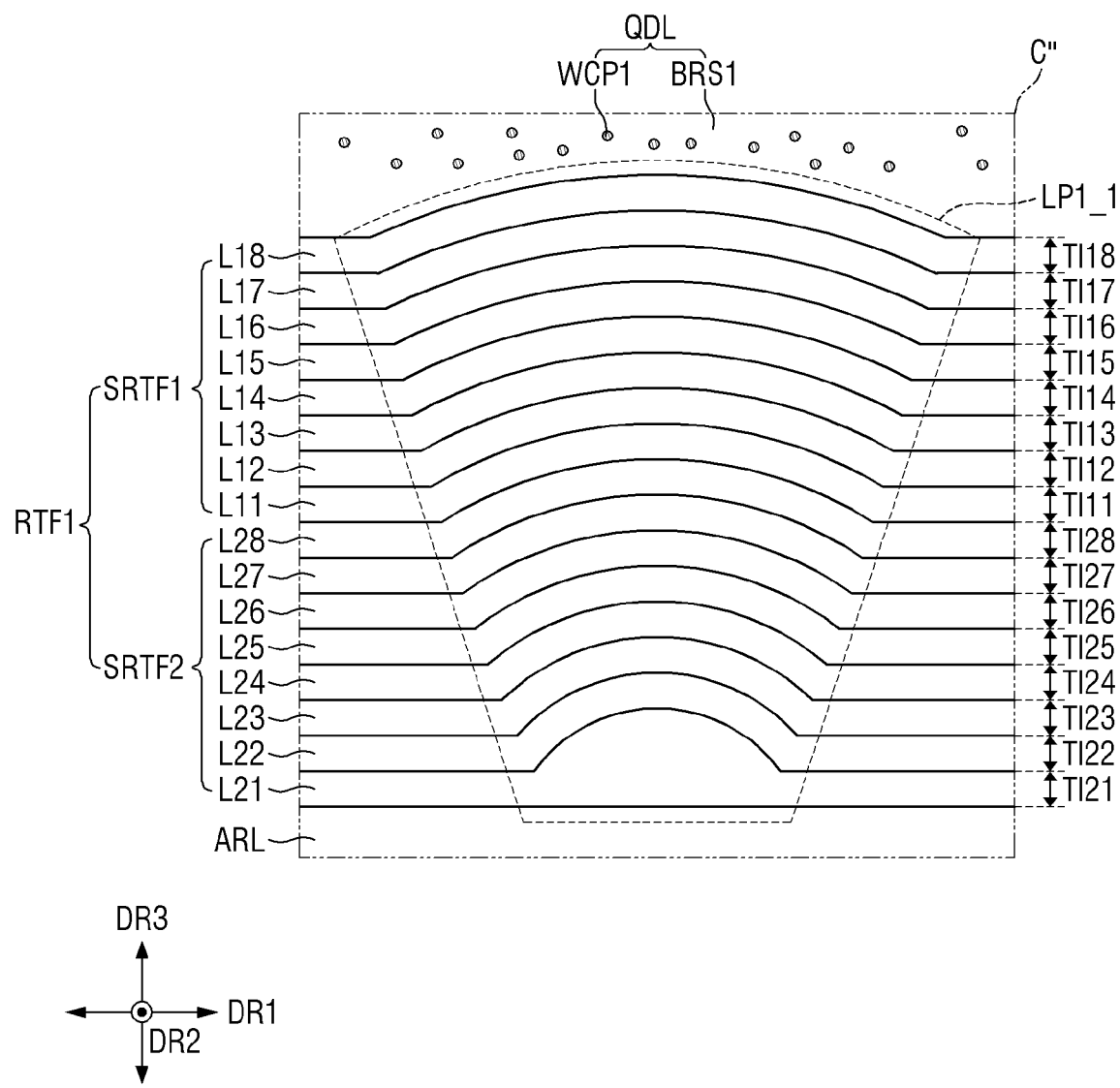
FIG. 24 is an enlarged cross-sectional view illustrating an example of the first selective transmission film of FIG. 23.
Figure 25:
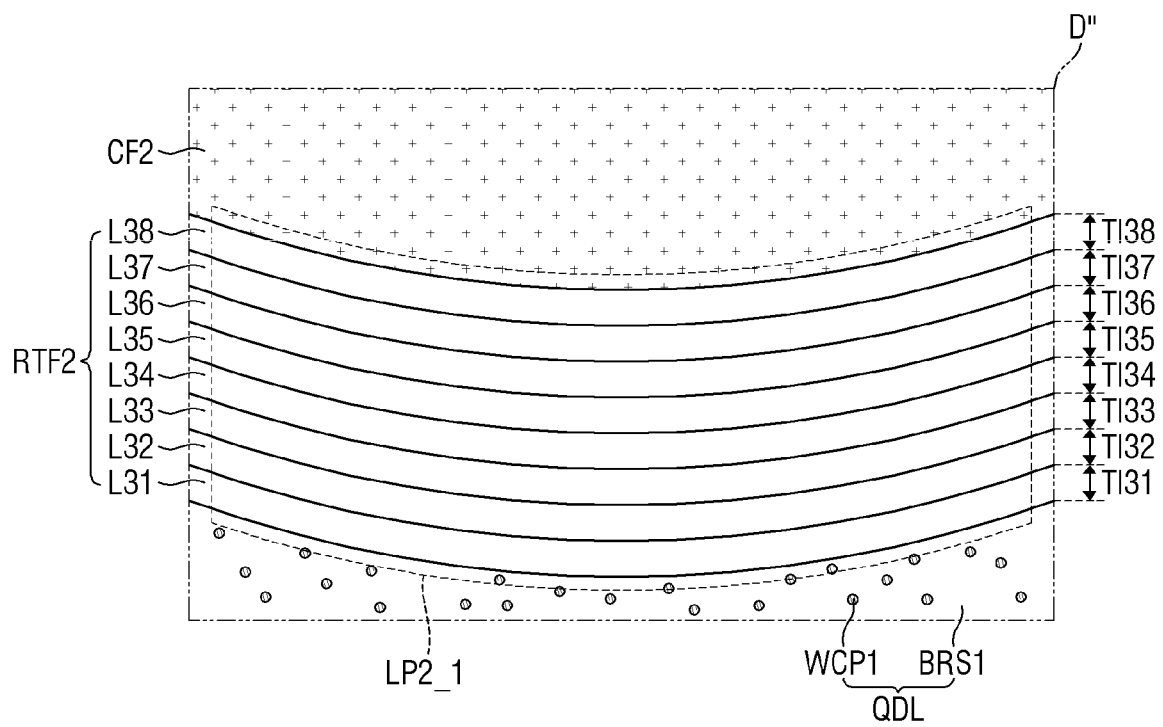
FIG. 25 is an enlarged cross-sectional view illustrating an example of the second selective transmission film of FIG. 23.

FIG. 24 is an enlarged cross-sectional view illustrating an example of the first selective transmission film RTF1 of FIG. 23. FIG. 25 is an enlarged cross-sectional view illustrating an example of the second selective transmission film RTF2 of FIG. 23. An enlarged cross-sectional view of an area C" of FIG. 23 is shown in FIG. 24, and an enlarged cross-sectional view of an area D" of FIG. 23 is shown in FIG. 25.

The embodiments of FIGS. 24 and 25 are different from the embodiments of FIGS. 8 and 9 in that the plurality of layers L11 to L18 of the first sub-selective transmission film SRTF1 of the first selective transmission film RTF1 and the plurality of layers L21 to L28 of the second sub-selective transmission film SRTF2 of the first selective transmission film RTF1 are formed to be convex toward an upper direction, and the plurality of layers L31 to L38 of the second selective transmission film RTF2 are formed to be convex toward a lower direction (e.g., concave). In FIGS. 24 and 25, the description will be mainly based on the difference from the embodiments of FIGS. 8 and 9.

Referring to FIGS. 24 and 25, each of the first to eighth layers L21, L22, L23, L24, L25, L26, L27 and L28 of the second sub-selective transmission film SRTF2 may include a first optical pattern LP1_1 formed to be convex toward an upper direction. An upper surface of the first layer L21 of the second sub-selective transmission film SRTF2 may have a section convex toward an upper direction, and each of the second to eighth layers L22, L23, L24, L25, L26, L27 and L28 of the second sub-selective transmission film SRTF2 may be aligned along a shape of the upper surface of the first layer L21. Therefore, a portion of an upper surface of each of the second to eighth layers L22, L23, L24, L25, L26, L27 and L28 of the second sub-selective transmission film SRTF2 may have a section convex toward an upper direction.

Each of the first to eighth layers L11, L12, L13, L14, L15, L16, L17 and L18 of the first sub-selective transmission film SRTF1 may include the first optical pattern LP1_1 formed to be convex toward an upper direction. Each of the first to eighth layers L11, L12, L13, L14, L15, L16, L17 and L18 of the first sub-selective transmission film SRTF1 may be aligned along a shape of the upper surface of the eighth layer L28 of the second sub-selective transmission film SRTF2. Therefore, an upper surface of each of the first to eighth layers L11, L12, L13, L14, L15, L16, L17 and L18 of the first sub-selective transmission film SRTF1 may have a section convex toward an upper direction.

Each of the first to eighth layers L31, L32, L33, L34, L35, L36, L37 and L38 of the second selective transmission film RTF2 may include a second optical pattern LP2_1 formed to be convex toward a lower direction. Each of the first to eighth layers L31, L32, L33, L34, L35, L36, L37 and L38 of the second selective transmission film RTF2 may be aligned along a shape of the upper surface of the wavelength conversion layer QDL, and the upper surface of the wavelength conversion layer QDL may have a section convex toward a lower direction. Therefore, a lower surface of each of the first to eighth layers L31, L32, L33, L34, L35, L36, L37 and L38 of the second selective transmission film RTF2 may have a section convex toward a lower direction.

Figure 26:
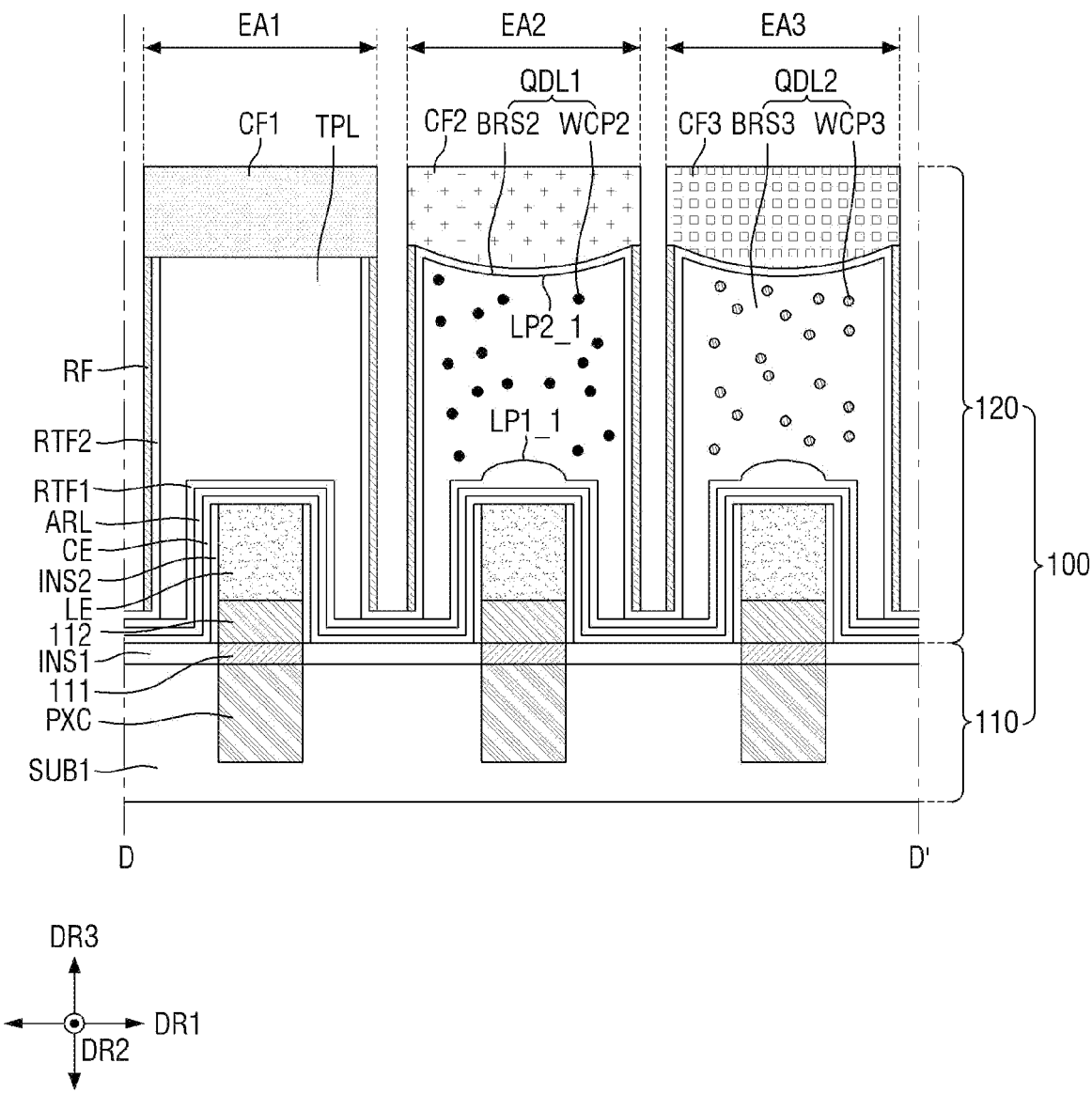
FIG. 26 is a cross-sectional view illustrating another example of a display panel taken along line D-D' of FIG. 21.

FIG. 26 is a cross-sectional view illustrating another example of a display panel taken along line D-D' of FIG. 21.

The embodiment of FIG. 26 is different from the embodiment of FIG. 22 in that a first wavelength conversion layer QDL1 is provided in each of the second light emitting areas EA2 and a second wavelength conversion layer QDL2 is provided in each of the third light emitting areas EA3. Because the first wavelength conversion layer QDL1 and the second wavelength conversion layer QDL2 in the embodiment of FIG. 26 are substantially the same as those described with reference to FIG. 14, the description of these elements of FIG. 26 will not be provided again.

Figure 27:
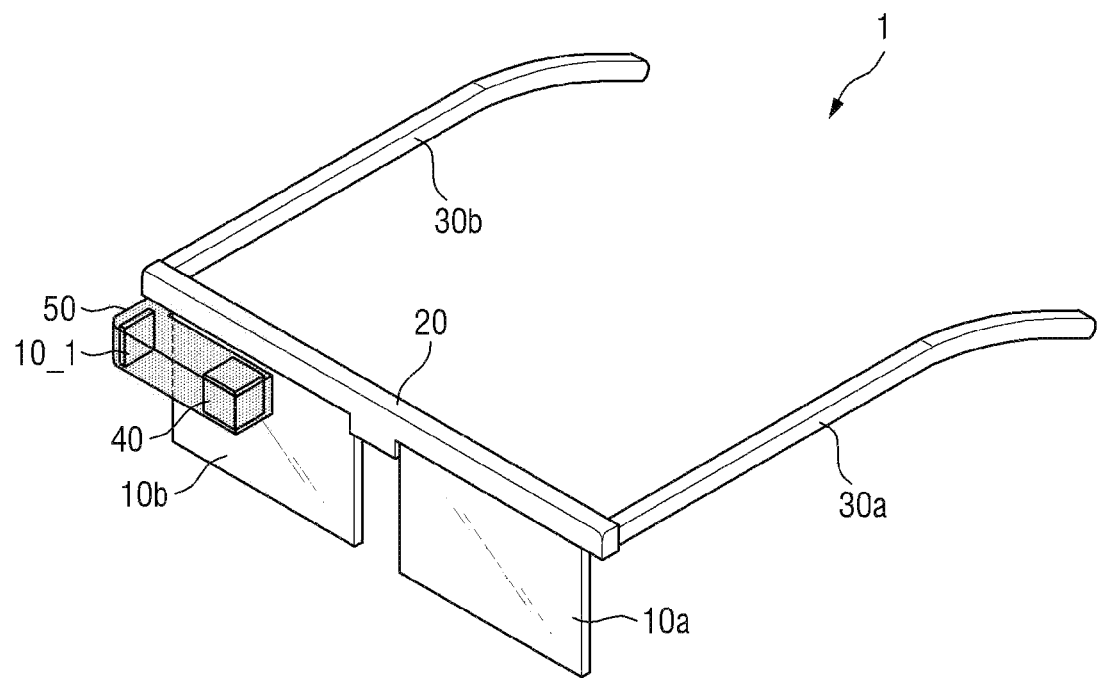
FIG. 27 is a perspective view illustrating a virtual reality device including a display device according to one or more embodiments.

FIG. 27 is an example view illustrating a virtual reality device including a display device according to one or more embodiments. In FIG. 27, a virtual reality device 1 to which a display device 10_1 according to one or more embodiments is applied is shown.

Referring to FIG. 27, the virtual reality device 1 according to one or more embodiments may be a glasses-type (e.g., glasses-like) device. The virtual reality device 1 according to one or more embodiments may include a display device 10_1, a left-eye lens 10a, a right-eye lens 10b, a support frame 20, glasses frame legs 30a and 30b, a reflection member 40, and a display device accommodating portion 50.

Although FIG. 27 illustrates the virtual reality device 1 that includes glasses frame legs 30a and 30b, the virtual reality device 1 according to one or more embodiments may be applied to a head mounted display including a head mounting band, which may be mounted on a head of the user, instead of using the glasses frame legs 30a and 30b. For example, the virtual reality device 1 according to one or more embodiments is not limited to that shown in FIG. 27, and is applicable to various suitable electronic devices in various suitable forms.

The display device accommodating portion 50 may include a display device 10_1 and a reflection member 40. The image displayed on the display device 10_1 may be reflected by the reflection member 40 and provided to a user's right eye through the right-eye lens 10b. For this reason, the user may view a virtual reality image displayed on the display device 10_1 through the right eye.

Although FIG. 27 illustrates that the display device accommodating portion 50 is positioned at a right end of the support frame 20, the embodiment of the present disclosure is not limited thereto. For example, the display device accommodating portion 50 may be at a left end of the support frame 20, and in this case, the image displayed on the display device 10_1 may be reflected by the reflection member 40 and provided to the user's left eye through the left-eye lens 10a. For this reason, the user may view the virtual reality image displayed on the display device 10_1 through the left eye. In one or more embodiments, the display device accommodating portion 50 may be positioned at both the left end and the right end of the support frame 20, and in this case, the user may view the virtual reality image displayed on the display device 10_1 through both the left eye and the right eye.

Figure 28:
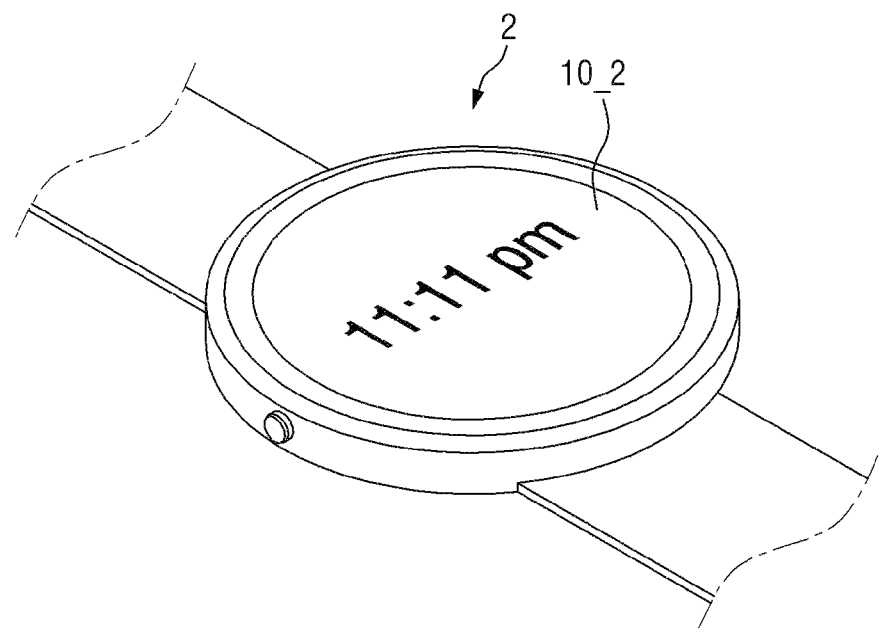
FIG. 28 is a perspective view illustrating a smart device including a display device according to one or more embodiments.

FIG. 28 is an example view illustrating a smart device including a display device according to one or more embodiments.

Referring to FIG. 28, a display device 10_2 according to one or more embodiments may be applied to a smart watch 2, which is one of the smart device.

Figure 29:
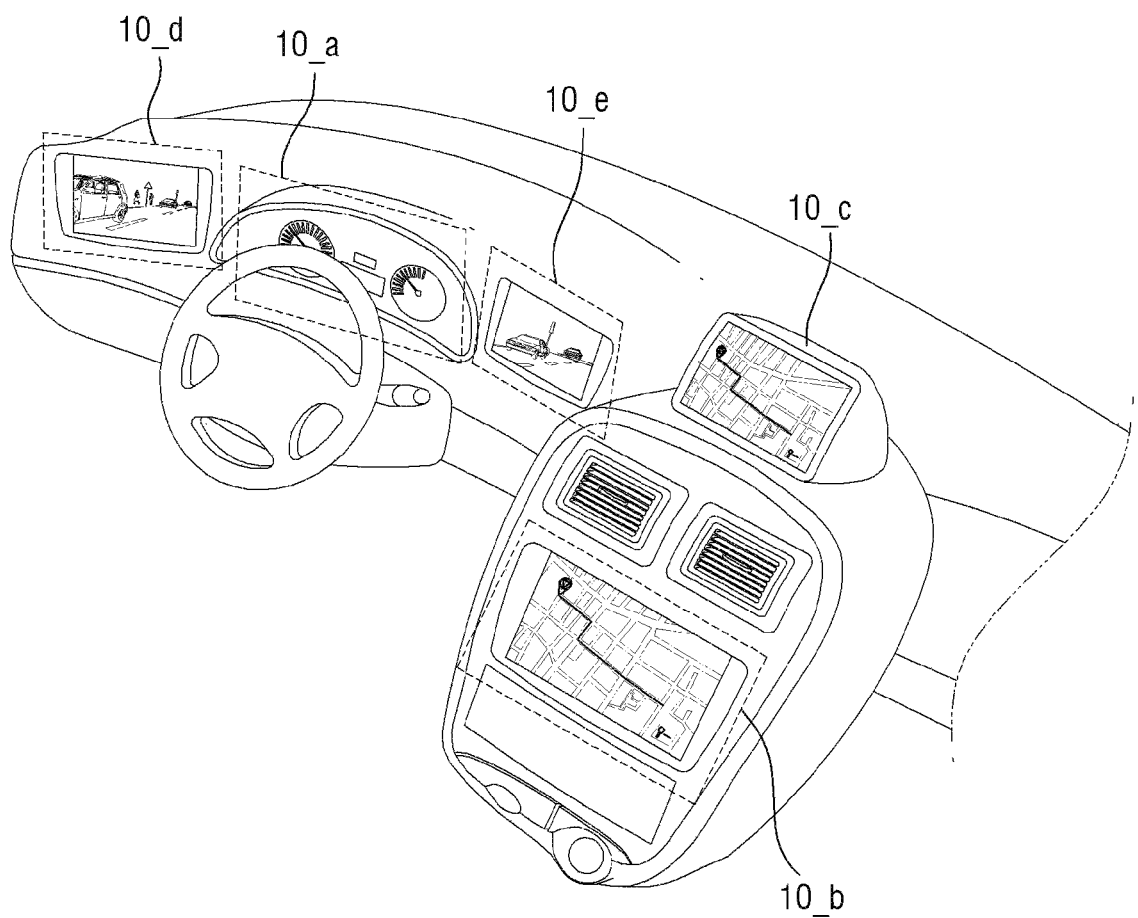
FIG. 29 is a perspective view illustrating a vehicle dashboard and a center fascia (e.g., center panel) including a display device according to one or more embodiments.

FIG. 29 is an example view illustrating a vehicle dashboard and a center fascia (e.g., center panel) including a display device according to one or more embodiments. A vehicle to which display devices 10_a, 10_b, 10_c, 10_d and 10_e according to one or more embodiments are applied is shown in FIG. 29.

Referring to FIG. 29, the display devices 10_a, 10_b and 10_c according to one or more embodiments may be applied to a dashboard of the vehicle, applied to a center fascia of the vehicle, or applied to a center information display (CID) on the dashboard of the vehicle. In addition, the display devices 10_d and 10_e according to one or more embodiments may be applied to a room mirror display that replaces a side mirror of the vehicle.

Figure 30:
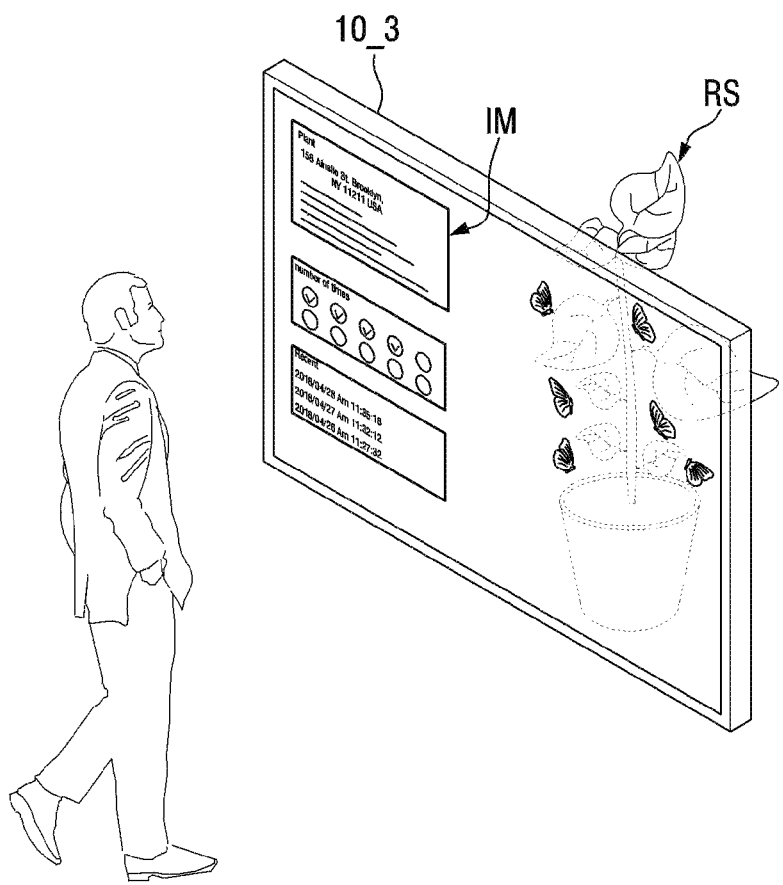
FIG. 30 is a perspective view illustrating a transparent display device including a display device according to one or more embodiments.

FIG. 30 is an example view illustrating a transparent display device including a display device according to one or more embodiments.

Referring to FIG. 30, a display device 10_3 according to one or more embodiments may be applied to the transparent display device. The transparent display device may display an image IM and at the same time transmit light. Therefore, a user located on a front surface of the transparent display device may not only view the image IM displayed on the display device 10_3 but also view an object RS or background located on a rear surface of the transparent display device. When the display device 10_3 is applied to the transparent display device, the base substrate BSUB of the display device 10_3 shown in FIG. 4D and the first substrate SUB1 of the display device 10_3 shown in FIG. 5 may include a light transmitting portion capable of transmitting light and/or may be formed of a material capable of transmitting light.

Figure 31:
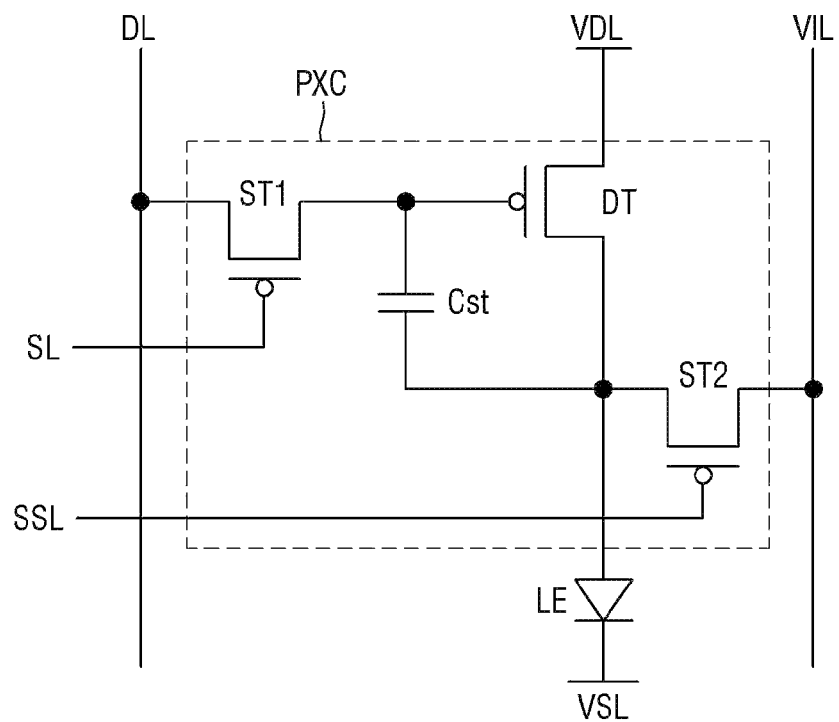
FIG. 31 is a circuit view (e.g., circuit diagram) of a pixel circuit area and a light emitting element according to one or more embodiments.

FIG. 31 is a circuit view of a pixel circuit area and a light emitting element according to one or more embodiments.

An example of the pixel circuit area PXC and the light emitting element LE of FIG. 5 is shown in FIG. 31.

Referring to FIG. 31, the light emitting element LE emits light in accordance with a driving current Ids. The emission amount of the light emitting element LE may be proportional to the driving current Ids. The light emitting element LE may be an inorganic light emitting element that includes an anode electrode, a cathode electrode, and an inorganic semiconductor between the anode electrode and the cathode electrode. For example, the light emitting element LE may be a micro light emitting diode.

The anode electrode of the light emitting element LE may be connected (e.g., electrically coupled) to a source electrode of a driving transistor DT, and the cathode electrode thereof may be connected (e.g., electrically coupled) to a second power line VSL to which a low potential voltage lower than a high potential voltage is supplied.

The driving transistor DT adjusts a current flowing from a first power line VDL, to which a first power voltage is supplied, to the light emitting element LE in accordance with a voltage difference between a gate electrode and the source electrode. The gate electrode of the driving transistor DT may be connected to a first electrode of a first transistor ST1, the source electrode of the driving transistor DT may be connected to the anode electrode of the light emitting element LE, and its drain electrode may be connected to the first power line VDL to which a high potential voltage is applied.

The first transistor ST1 is turned on by a scan signal of a scan line SL to connect a data line DL to the gate electrode of the driving transistor DT. A gate electrode of the first transistor ST1 may be connected to the scan line SL, its first electrode may be connected to the gate electrode of the driving transistor DT, and its second electrode may be connected to the data line DL.

A second transistor ST2 is turned on by a sensing signal of a sensing signal line SSL to connect an initialization voltage line VIL to the source electrode of the driving transistor DT. A gate electrode of the second transistor ST2 may be connected to the sensing signal line SSL, its first electrode may be connected to the initialization voltage line VIL, and its second electrode may be connected to the source electrode of the driving transistor DT.

Although first electrode of each of the first and second transistors ST1 and ST2 may be a source electrode and the second electrode thereof may be a drain electrode, it should be noted that they are not limited thereto. For example, the first electrode of each of the first and second transistors ST1 and ST2 may be a drain electrode and the second electrode thereof may be a source electrode.

A capacitor Cst is formed between the gate electrode and the source electrode of the driving transistor DT. The capacitor Cst stores a differential voltage between a gate voltage and a source voltage of the driving transistor DT.

Although the driving transistor DT and the first and second transistors ST1 and ST2 are formed of N-type metal oxide semiconductor field effect transistors (MOSFETs) in FIG. 31, it should be noted that the transistors are not limited thereto. The driving transistor DT and the first and second transistors ST1 and ST2 may be formed of P-type MOSFETs.

Figure 32:
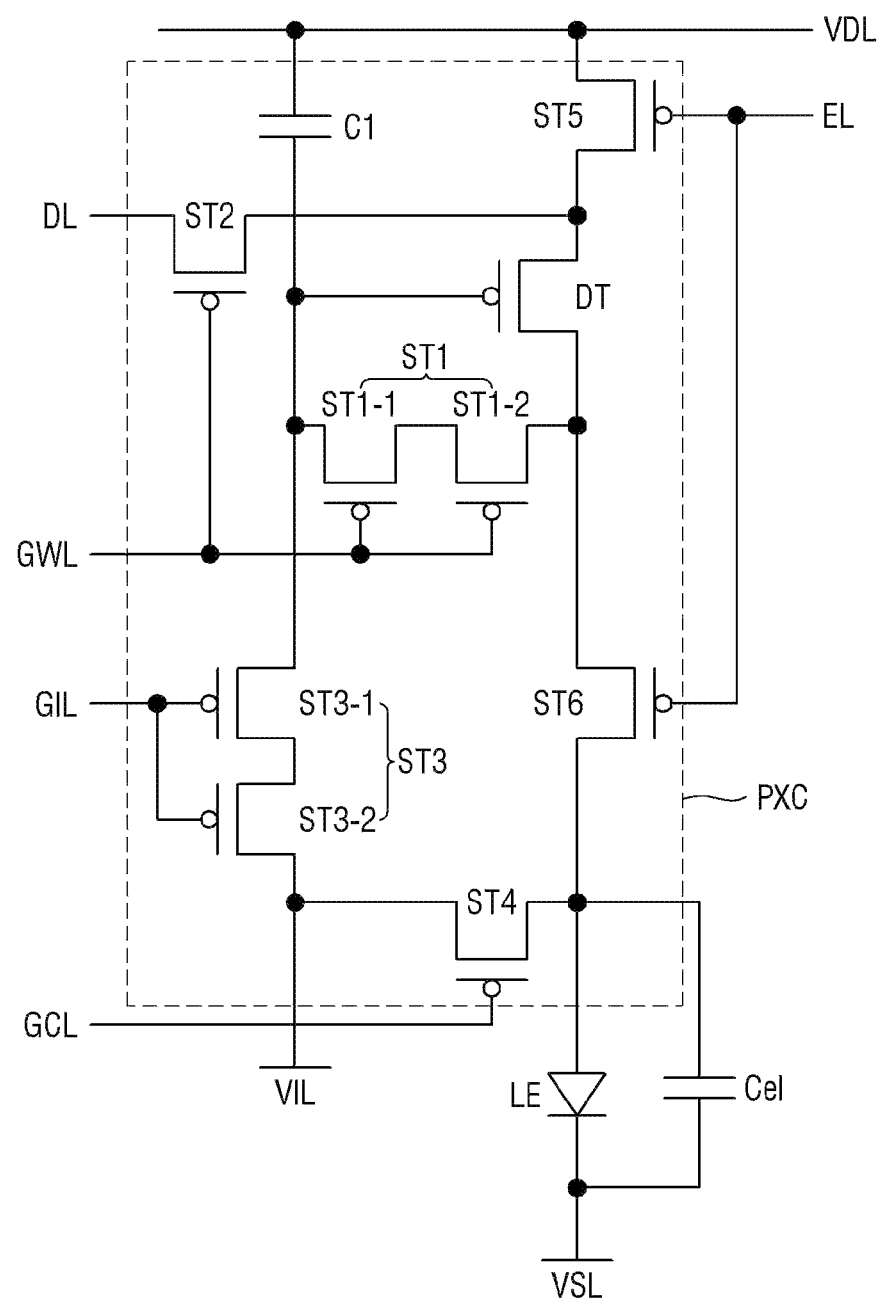
FIG. 32 is a circuit view (e.g., circuit diagram) of a pixel circuit area and a light emitting element according to one or more other embodiments.

FIG. 32 is a circuit view of a pixel circuit area and a light emitting element according to one or more other embodiments.

Another example of the pixel circuit area PXC and the light emitting element LE of FIG. 5 is shown in FIG. 32.

Referring to FIG. 32, the light emitting element LE emits light in accordance with the driving current Ids. The emission amount of the light emitting element LE may be proportional to the driving current Ids. The light emitting element LE may be an inorganic light emitting element that includes an anode electrode, a cathode electrode, and an inorganic semiconductor between the anode electrode and the cathode electrode. For example, the light emitting element LE may be a micro light emitting diode.

The anode electrode of the light emitting element LE may be connected to a first electrode of a fourth transistor ST4 and a second electrode of a sixth transistor ST6, and the cathode electrode thereof may be connected to the first power line VDL. A parasitic capacitance Cel may be formed between the anode electrode and the cathode electrode of the light emitting element LE.

The pixel circuit area PXC includes a driving transistor DT, switch elements, and a capacitor C1. The switch elements include first to sixth transistors ST1, ST2, ST3, ST4, ST5 and ST6. Further, the first transistor ST1 includes a first sub-transistor ST1-1 and a second sub-transistor ST1-2 connected in series. The third transistor ST3 includes a third sub-transistor ST3-1 and a fourth sub-transistor ST3-2 connected in series.

The driving transistor DT includes a gate electrode, a first electrode, and a second electrode. The driving transistor DT controls a drain-source current Ids (hereinafter, referred to as "driving current") flowing between the first electrode and the second electrode in accordance with a data voltage applied to the gate electrode.

The capacitor C1 is formed between the second electrode of the driving transistor DT and the second power line VSL. One electrode of the capacitor C1 may be connected to the second electrode of the driving transistor DT, and the other electrode thereof may be connected to the second power line VSL.

When a first electrode of each of the first to sixth transistors ST1, ST2, ST3, ST4, ST5 and ST6 and the driving transistor DT is a source electrode, a second electrode thereof may be a drain electrode. In one or more embodiments, when the first electrode of each of the first to sixth transistors ST1, ST2, ST3, ST4, ST5 and ST6 and the driving transistor DT is a drain electrode, the second electrode thereof may be a source electrode.

An active layer of each of the first to sixth transistors ST1, ST2, ST3, ST4, ST5 and ST6 and the driving transistor DT may be formed of any one of poly silicon, amorphous silicon, and/or oxide semiconductor. When the semiconductor layer of each of the first to sixth transistors ST1, ST2, ST3, ST4, ST5 and ST6 and the driving transistor DT is formed of poly silicon, a process of forming the same may be a low temperature poly silicon (LTPS) process.

Although the first to sixth transistors ST1, ST2, ST3, ST4, ST5 and ST6 and the driving transistor DT are formed of P-type MOSFETs in FIG. 32, the transistors are not limited thereto, and may be formed of N-type MOSFETs.

In one or more embodiments, the first power voltage of the first power line VDL, a second power voltage of the second power line VSL, and a third power voltage of a third power line VIL (e.g., the initialization voltage line VIL) may be set in consideration of characteristics of the driving transistor DT, characteristics of the light emitting element LE, and the like.

Figure 33:
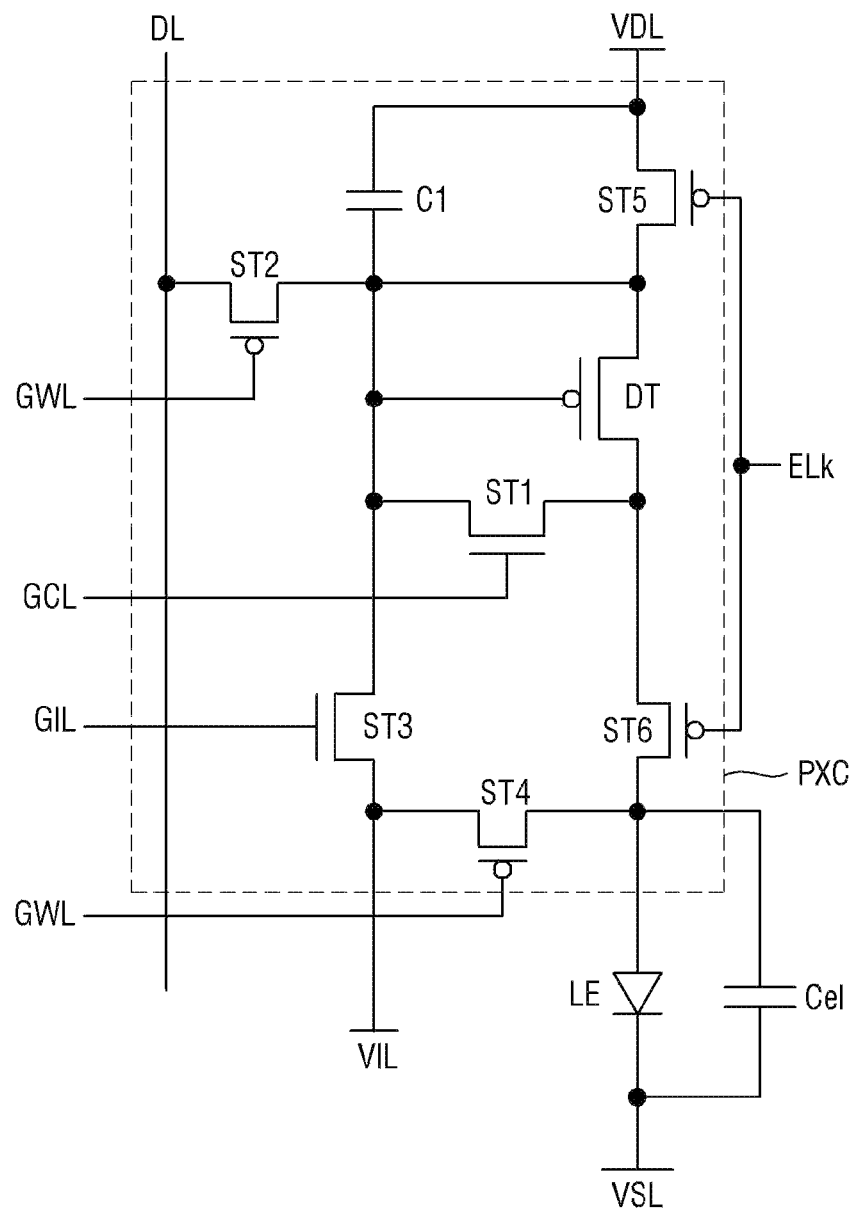
FIG. 33 is a circuit view (e.g., circuit diagram) of a pixel circuit area and a light emitting element according to one or more other embodiments.

FIG. 33 is a circuit view of a pixel circuit area and a light emitting element according to one or more other embodiments.

Another example of the pixel circuit area PXC and the light emitting element LE of FIG. 5 is shown in FIG. 33.

The embodiment of FIG. 33 is different from the embodiment of FIG. 32 in that the driving transistor DT, the second transistor ST2, the fourth transistor ST4, the fifth transistor ST5 and the sixth transistor ST6 are formed of P-type MOSFETs, and the first transistor ST1 and the third transistor ST3 are formed of N-type MOSFETs.

Referring to FIG. 33, the active layer of each of the driving transistor DT, the second transistor ST2, the fourth transistor ST4, the fifth transistor ST5 and the sixth transistor ST6, which are formed of P-type MOSFETs, may be formed of poly silicon, and the active layer of each of the first transistor ST1 and the third transistor ST3, which are formed of N-type MOSFETs, may be formed of an oxide semiconductor.

The embodiment of FIG. 33 is different from the embodiment of FIG. 32 in that the gate electrode of the second transistor ST2 and the gate electrode of the fourth transistor ST4 are connected to a write scan line GWL, and the gate electrode of the first transistor ST1 is connected to a control scan line GCL. In FIG. 33, because the first transistor ST1 and the third transistor ST3 are formed of N-type MOSFETs, a scan signal of a gate high voltage may be applied to the control scan line GCL and an initialization scan line GIL. In contrast, because the second transistor ST2, the fourth transistor ST4, the fifth transistor ST5 and the sixth transistor ST6 are formed of P-type MOSFETs, a scan signal of a gate low voltage may be applied to the write scan line GWL and a light emission line EL.

It should be noted that the pixel circuit area PXC according to the embodiments of the present disclosure is not limited to that shown in FIGS. 31 to 33. The pixel circuit area PXC according to one or more embodiments of the present disclosure may be formed in other suitable circuit structures, which may be adopted by those skilled in the art, in addition to the embodiments shown in FIGS. 31 to 33.

It will be understood by those of ordinary skill in the art that the aspects of the present disclosure are not restricted to the ones set forth herein. The above and other aspects of the present disclosure will become more apparent to one of ordinary skill in the art to which the present disclosure pertains by referencing the claims, with functional equivalents thereof to be included therein.

What is claimed is:

1. A display device comprising:
   a substrate;
   a light emitting element on the substrate to emit first light;
   a wavelength conversion layer on the light emitting element and comprising wavelength conversion particles to convert the first light into second light;
   a first selective transmission film between the light emitting element and the wavelength conversion layer, to reflect the first light and the second light, which are incident from the wavelength conversion layer; and
   a second selective transmission film on the wavelength conversion layer, to reflect the first light incident from the wavelength conversion layer and to transmit the second light.

2. The display device of claim 1, wherein the first selective transmission film comprises:
   a first sub-selective transmission film to reflect the first light incident from the wavelength conversion layer and to transmit the second light; and
   a second sub-selective transmission film to reflect the second light incident from the wavelength conversion layer and to transmit the first light.

3. The display device of claim 2, wherein the first sub-selective transmission film comprises a plurality of first odd numbered layers having a first refractive index and a plurality of first even numbered layers having a second refractive index lower than the first refractive index, and the plurality of first odd numbered layers and the plurality of first even numbered layers are alternately arranged with each other in a thickness direction of the substrate.

4. The display device of claim 3, wherein an uppermost layer of the plurality of first even numbered layers is in contact with the wavelength conversion layer.

5. The display device of claim 2, wherein the second sub-selective transmission film comprises a plurality of second odd numbered layers having a first refractive index and a plurality of second even numbered layers having a second refractive index higher than the first refractive index, and the plurality of second odd numbered layers and the plurality of second even numbered layers are alternately arranged with each other in a thickness direction of the substrate.

6. The display device of claim 5, wherein an uppermost layer of the plurality of second even numbered layers is in contact with the first sub-selective transmission film.

7. The display device of claim 1, wherein the second selective transmission film comprises a plurality of third odd numbered layers having a first refractive index and a plurality of third even numbered layers having a second refractive index higher than the first refractive index, and the plurality of third odd numbered layers and the plurality of third even numbered layers are alternately arranged with each other in a thickness direction of the substrate.

8. The display device of claim 7, wherein the layer disposed on the lowest portion of the plurality of third odd numbered layers is in contact with the wavelength conversion layer.

9. The display device of claim 1, further comprising a color filter on the second selective transmission film, to block, absorb, or reduce the first light and to transmit at least a portion of the second light.

10. The display device of claim 1, wherein the first selective transmission film comprises a first optical pattern, and the second selective transmission film comprises a second optical pattern.

11. The display device of claim 10, wherein each of the first optical pattern and the second optical pattern is convex toward an upper direction.

12. The display device of claim 10, wherein an area of the first optical pattern is smaller than an area of the second optical pattern.

13. The display device of claim 10, wherein a curvature radius of the first optical pattern is smaller than a curvature radius of the second optical pattern.

14. The display device of claim 10, wherein an area of the first optical pattern is smaller than an area of the light emitting element.

15. The display device of claim 10, wherein an area of the second optical pattern is greater than an area of the light emitting element.

16. The display device of claim 10, wherein the first optical pattern is convex toward an upper direction, and the second optical pattern is convex toward a lower direction.

17. A display device comprising:
   a light emitting element in each of a first light emitting area to emit first light, a second light emitting area to emit second light, and a third light emitting area to emit third light;
   a light transmitting layer on the light emitting element in the first light emitting area;
   a wavelength conversion layer on the light emitting element in each of the second light emitting area and the third light emitting area;
   a first selective transmission film between the light emitting element and the wavelength conversion layer in each of the first light emitting area, the second light emitting area, and the third light emitting area; and
   a second selective transmission film on the wavelength conversion layer in the second light emitting area,
   wherein the first selective transmission film is to reflect the first light and the second light, which are incident from the wavelength conversion layer, and
   the second selective transmission film is to reflect the first light incident from the wavelength conversion layer and to transmit the second light.

18. The display device of claim 17, further comprising the second selective transmission film on the wavelength conversion layer in the third light emitting area,
   wherein the second selective transmission film in the third light emitting area is to transmit the third light incident from the wavelength conversion layer.

19. The display device of claim 18, further comprising:
a first color filter on the light transmitting layer in the first light emitting area, to transmit the first light, and to absorb, block, or reduce the second light and the third light;
a second color filter on the wavelength conversion layer in the second light emitting area, to transmit the second light, and to absorb, block, or reduce the first light and the third light; and
a third color filter on the wavelength conversion layer in the third light emitting area, to transmit the third light, and to absorb, block, or reduce the first light and the second light.

20. A display device comprising:
a light emitting element in each of a first light emitting area to emit first light, a second light emitting area to emit second light, and a third light emitting area to emit third light;
a light transmitting layer on the light emitting element in the first light emitting area;
a wavelength conversion layer on the light emitting element in each of the second light emitting area and the third light emitting area;
a first selective transmission film between the light emitting element and the wavelength conversion layer in at least one of the first light emitting area, the second light emitting area, or the third light emitting area, first selective transmission film comprising a first optical pattern overlapping the light emitting element; and
a second optical pattern on the wavelength conversion layer in at least one of the first light emitting area, the second light emitting area, or the third light emitting area, the second optical pattern overlapping the first optical pattern,
wherein the second optical pattern has a curvature radius greater than a curvature radius of the first optical pattern.

* * * * *